United States Patent
Yeh

(10) Patent No.: US 9,430,327 B2
(45) Date of Patent: Aug. 30, 2016

(54) DATA ACCESS METHOD, MEMORY CONTROL CIRCUIT UNIT AND MEMORY STORAGE APPARATUS

(71) Applicant: PHISON ELECTRONICS CORP., Miaoli (TW)

(72) Inventor: Chih-Kang Yeh, Kinmen County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 41 days.

(21) Appl. No.: 14/572,793

(22) Filed: Dec. 17, 2014

(65) Prior Publication Data

US 2016/0132387 A1 May 12, 2016

(30) Foreign Application Priority Data

Nov. 6, 2014 (TW) .............................. 103138539 A

(51) Int. Cl.
*G11C 29/00* (2006.01)
*G06F 11/10* (2006.01)
*G11C 29/52* (2006.01)

(52) U.S. Cl.
CPC ........... *G06F 11/1068* (2013.01); *G11C 29/52* (2013.01)

(58) Field of Classification Search
CPC .......................... G06F 11/1068; G11C 29/52
See application file for complete search history.

(56) References Cited

U.S. PATENT DOCUMENTS

| 7,559,004 B1* | 7/2009 | Chang | H03M 13/11 |
| | | | 714/708 |
| 2011/0320915 A1* | 12/2011 | Khan | G06F 3/0608 |
| | | | 714/773 |
| 2012/0173955 A1* | 7/2012 | Liang | G06F 11/1048 |
| | | | 714/773 |
| 2012/0260149 A1* | 10/2012 | Chang | G06F 11/1068 |
| | | | 714/773 |

* cited by examiner

*Primary Examiner* — Sam Rizk
(74) *Attorney, Agent, or Firm* — Jianq Chyun IP Office

(57) ABSTRACT

A data access method for a rewritable non-volatile memory module is provided. The method includes: filling dummy data to first data in order to generate second data, and writing the second data and an error checking and correcting code (ECC code) corresponding to the second data into a first physical programming unit. The method also includes: reading data stream from the first physical programming unit, wherein the data stream includes third data and the ECC code. The method further includes: adjusting the third data according to a pattern of the dummy data in order to generate fourth data when the third data cannot be corrected by using the ECC code, and using the ECC code to correct the fourth data in order to obtain corrected data, wherein the corrected data is identical to the second data.

27 Claims, 15 Drawing Sheets

DATA ACCESS METHOD, MEMORY CONTROL CIRCUIT UNIT AND MEMORY STORAGE APPARATUS

CROSS-REFERENCE TO RELATED APPLICATION

This application claims the priority benefit of Taiwan application serial no. 103138539, filed on Nov. 6, 2014. The entirety of the above-mentioned patent application is hereby incorporated by reference herein and made a part of this specification.

BACKGROUND

1. Technical Field

The present invention relates to a data access method, and more particularly, relates to a data access method, a memory storage apparatus and a memory control circuit unit for a rewritable non-volatile memory module.

2. Description of Related Art

The growth of digital cameras, mobile phones, and MP3 players has been expanded rapidly in recent years. Consequently, the consumers' demand for storage media has increased tremendously. A rewritable non-volatile memory is one of the most adaptable memories for portable electronic products such as notebook computers due to its data non-volatility, low power consumption, small volume, non-mechanical structure and high read/write speed. A solid state drive is a storage apparatus which utilizes a flash memory as its storage medium. For these reasons, the flash memory has become an import part of the electronic industries.

Data stored in the rewritable non-volatile memory may generate error bits due various factors (e.g., current leakage, programming failures and damages on the memory cell, and etc.). Therefore, an error checking and correcting circuit is generally disposed in a memory storage system to generate an error checking and correcting code for the stored data in order to ensure data correctness. However, when the number of the error bits exceeds the number of the error bits that can be detected and corrected by the error checking and correcting circuit, the data containing the error bits cannot be corrected to thereby cause loss of data.

Accordingly, how to correct more of the error bits and ensure the data correctness is one of the major subjects in the industry.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention is directed to a data access method, a memory storage apparatus and a memory control circuit unit, which are capable of correcting more error bits in order to ensure a correctness and a reliability of the data.

A data access method for a rewritable non-volatile memory module is provided according to an exemplary embodiment of the invention. The rewritable non-volatile memory module includes a plurality of physical erasing units, and each of the physical erasing units includes a plurality of physical programming units. The data access method includes: filling dummy data to first data to generate second data, generating an error checking and correcting code corresponding to the second data, generating an error checking and correcting code frame according to the second data and the error checking and correcting code, writing the error checking and correcting code frame into a first physical programming unit among the physical programming units, and mapping a logical address to the first physical programming unit. The data access method also includes: receiving a read command, wherein the read command instructs to read data from the logical address; and reading the error checking and correcting code frame from the first physical programming unit to obtain a reading data stream, wherein the reading data stream includes third data and the error checking and correcting code. The data access method further includes: adjusting the third data according to a pattern of the dummy data to generate fourth data when the third data cannot be corrected by using the error checking and correcting code to obtain corrected data, and using the error checking and correcting code to correct the fourth data to obtain corrected data, wherein the corrected data is identical to the second data; and removing the dummy data from the corrected data to obtain fifth data.

A memory control circuit unit for controlling a rewritable non-volatile memory module is provided according to an exemplary embodiment of the present invention. The memory control circuit unit includes a host interface, a memory interface, a memory management circuit and a data compressing/decompressing circuit. The host interface is coupled to a host system. The memory interface is configured to couple to the rewritable non-volatile memory module, wherein the rewritable non-volatile memory module includes multiple physical erasing units, and each physical erasing unit includes multiple physical programming units. The memory management circuit is coupled to the host interface and the memory interface, the error checking and correcting circuit is coupled to the memory management circuit, and the data compressing/decompressing circuit is coupled to the memory management circuit. The data compressing/decompressing circuit fills dummy data to first data to generate second data. The error checking and correcting circuit generates an error checking and correcting code corresponding to the second data. The memory management circuit further generates an error checking and correcting code frame according to the second data and the error checking and correcting code. The memory management circuit further issues a command sequence for writing the error checking and correcting code frame into a first physical programming unit among the physical programming units, and maps a logical address to the first physical programming unit. The memory management circuit receives a read command, wherein the read command instructs to read data from the logical address. The memory management circuit issues a command sequence for reading the error checking and correcting code frame from the first physical programming unit to obtain a reading data stream, wherein the reading data stream includes third data and the error checking and correcting code. Herein, the memory management circuit adjusts the third data according to a pattern of the dummy data to generate fourth data when the third data cannot be corrected by using the error checking and correcting code to obtain corrected data, and the error checking and correcting circuit uses the error checking and correcting code to correct the fourth data to obtain the corrected data, wherein the corrected data is identical to the second data. The memory management circuit removes the dummy data from the corrected data in order to obtain fifth data.

According to an exemplary embodiment of the invention, a memory storage apparatus including a connection interface unit, a rewritable non-volatile memory module and a memory control circuit unit is provided. The connection interface unit is configured to couple to a host system. The rewritable non-volatile memory module includes a plurality of physical erasing units, and each of the physical erasing units includes a plurality of physical programming units. The memory control circuit unit is coupled to the connection interface unit and the rewritable non-volatile memory module. The memory control circuit unit fills dummy data to first data to generate second data, generates an error checking and correcting code corresponding to the second data, generates an error checking and correcting code frame according to the second data and the error checking and correcting code, writes the error checking and correcting code frame into a first physical programming unit among the physical programming units, and maps a logical address to the first physical programming unit. The memory control circuit unit further receives a read command, wherein the read command instructs to read data from the logical address. The memory control circuit unit further reads the error checking and correcting code frame from the first physical programming unit to obtain a reading data stream, wherein the reading data stream includes third data and the error checking and correcting code. The memory control circuit unit further adjusts the third data according to a pattern of the dummy data in order to generate fourth data when the third data cannot be corrected by using the error checking and correcting code to obtain corrected data, and uses the error checking and correcting code to correct the fourth data to obtain the corrected data, wherein the corrected data is identical to the second data. The memory control circuit unit further removes the dummy data from the corrected data in order to obtain fifth data.

Based on the above, the data access method, the memory control circuit unit and the memory storage apparatus according to the exemplary embodiments of the invention are capable of adjusting the read data according to the pattern of the dummy data when the read data cannot be corrected by using the error checking and correcting code, so as to correct more error bits and ensure the correctness of the data being accessed Accordingly, a data correcting capability of the error checking and correcting code may be effectively improved.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
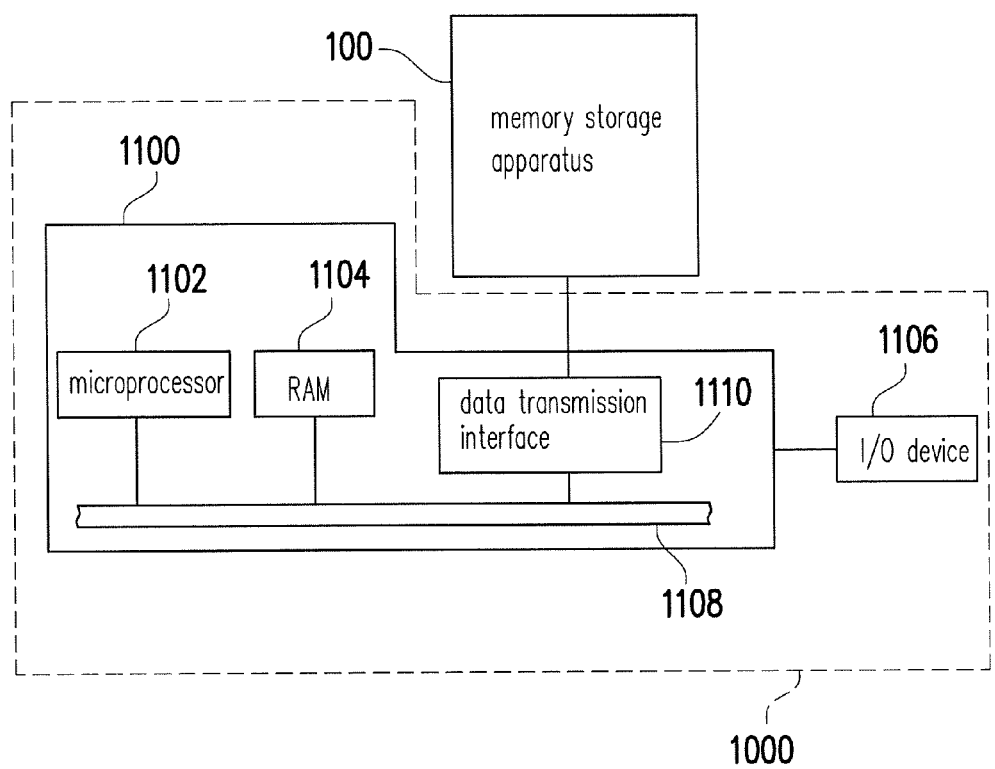
FIG. 1A is a schematic diagram illustrating a host system and a memory storage apparatus according to the first exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

First Exemplary Embodiment

Generally, a memory storage apparatus (also known as a memory storage system) includes a rewritable non-volatile memory module and a controller (also known as a control circuit). The memory storage apparatus is usually configured together with a host system so that the host system may write data to or read data from the memory storage apparatus.

FIG. 1A is a schematic diagram illustrating a host system and a memory storage apparatus according to the first exemplary embodiment.

Figure 1B:
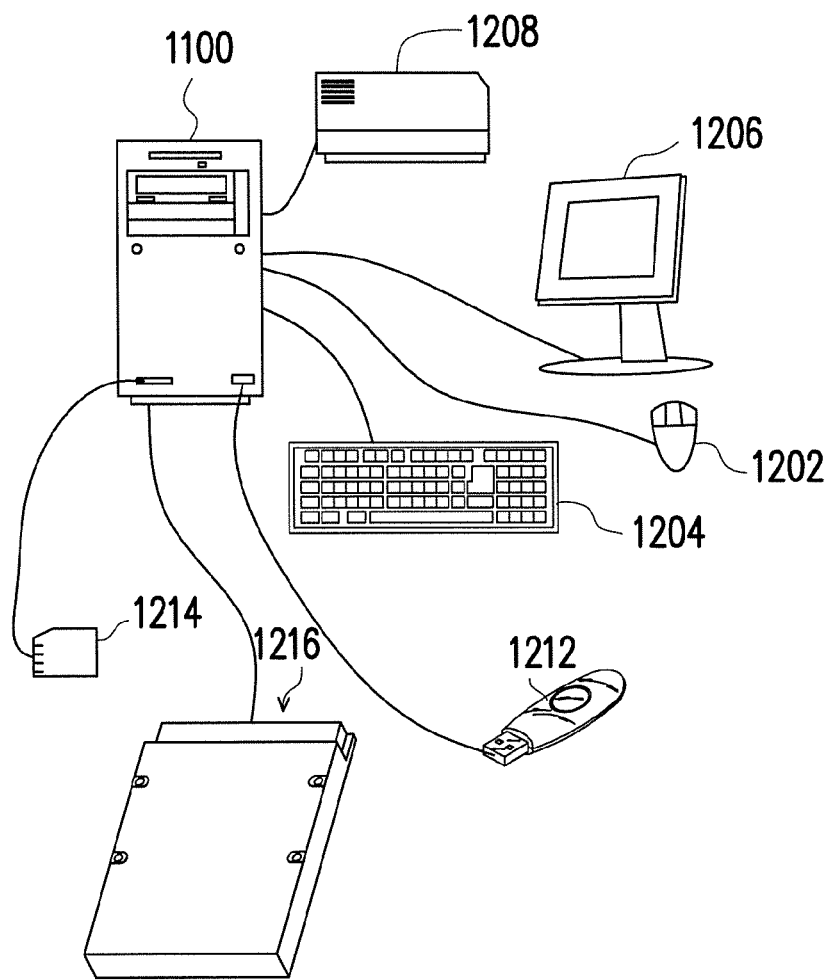
FIG. 1B is a schematic diagram illustrating a computer, an input/output device and a memory storage apparatus according to the first exemplary embodiment.

Referring to FIG. 1A, a host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206 and a printer 1208 as shown in FIG. 1B. It should be understood that the devices illustrated in FIG. 1B are not intended to limit the I/O device 1106, and the I/O device 1106 may further include other devices.

In the present embodiment, the memory storage apparatus 100 is electrically connected to other devices of the host system 1000 through the data transmission interface 1110. By using the microprocessor 1102, the random access memory 1104 and the Input/Output (I/O) device 1106, data may be written into the memory storage apparatus 100 or may be read from the memory storage apparatus 100. For example, the memory storage apparatus 100 may be a rewritable non-volatile memory storage apparatus such as a flash drive 1212, a memory card 1214, or a solid state drive (SSD) 1216 depicted in FIG. 1B.

Figure 1C:
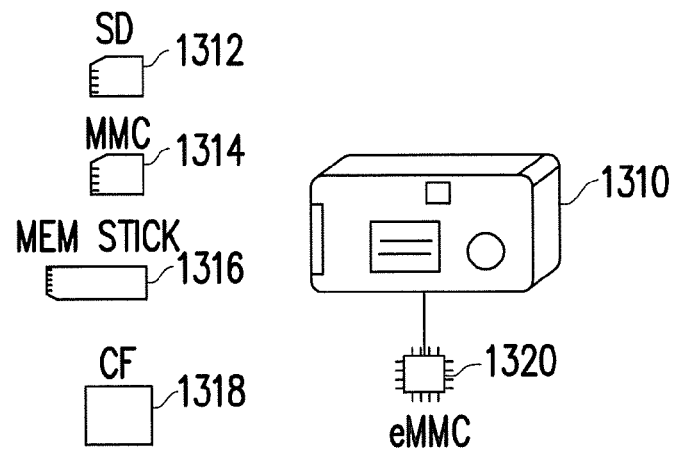
FIG. 1C is a schematic diagram illustrating a host system and a memory storage apparatus according to the first exemplary embodiment.

Generally, the host system 1000 may substantially be any system capable of storing data with the memory storage apparatus 100. Even though the host system 1000 is illustrated as a computer system in the present exemplary embodiment, in another exemplary embodiment of the present invention, the host system 1000 may be a digital camera, a video camera, a telecommunication device, an audio player, or a video player. For example, if the host system is a digital camera (video camera) 1310 depicted in FIG. 1C, the rewritable non-volatile memory storage apparatus may be a SD card 1312, a MMC card 1314, a memory stick 1316, a CF card 1318 or an embedded storage device 1320 (as shown in FIG. 1C). The embedded storage device 1320 includes an embedded MMC (eMMC). It should be mentioned that the eMMC is electrically connected to a substrate of the host system, directly.

Figure 2:
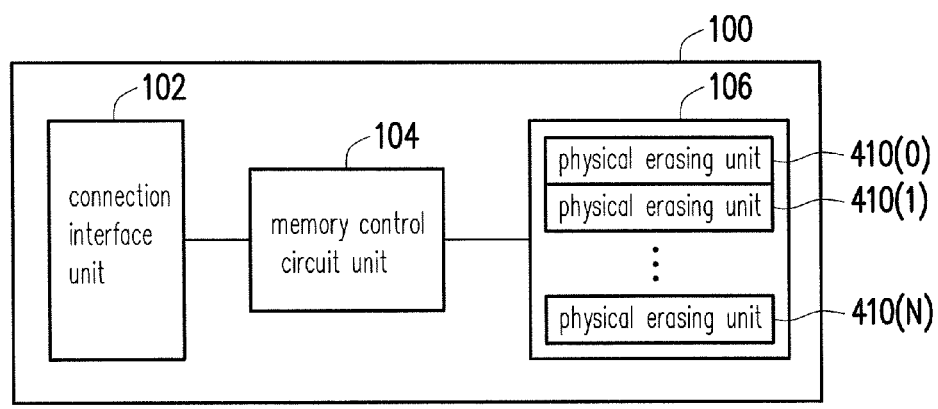
FIG. 2 is a schematic block diagram illustrating a memory storage apparatus according to the first exemplary embodiment.

FIG. 2 is a schematic block diagram illustrating a memory storage apparatus according to the first exemplary embodiment.

Referring to FIG. 2, the memory storage apparatus 100 includes a connection interface unit 102, a memory control circuit unit 104 and a rewritable non-volatile memory module 106.

In the present exemplary embodiment, the connection interface unit 102 is compatible with a serial advanced technology attachment (SATA) standard. However, the invention is not limited thereto, and the connection interface unit 102 may also be compatible with Parallel Advanced Technology Attachment (PATA) standard, Institute of Electrical and Electronic Engineers (IEEE) 1394 standard, Peripheral Component Interconnect (PCI) Express interface standard, Universal Serial Bus (USB) standard, Ultra High Speed-I (UHS-I) interface standard, Ultra High Speed-II (UHS-II) interface standard, Secure Digital (SD) interface standard, Memory Stick (MS) interface standard, Multi Media Card (MMC) interface standard, Compact Flash (CF) interface standard, Integrated Device Electronics (IDE) interface standard or other suitable standards. In the present exemplary embodiment, the connector and the memory control circuit unit may be packaged into one chip, or distributed outside of a chip containing the memory control circuit unit.

The memory control circuit unit 104 is configured to execute a plurality of logic gates or control commands which are implemented in a hardware form or in a firmware form, so as to perform operations of writing, reading, erasing and merging data in the rewritable non-volatile memory module 106 according to the commands of the host system 1000.

The rewritable non-volatile memory module 106 is coupled to the memory control circuit unit 104 and configured to store data written from the host system 1000. The rewritable non-volatile memory storage module 106 includes multiple physical erasing units 410(0) to 410(N). For example, the physical erasing units 410(0) to 410(N) may belong to the same memory die or belong to different memory dies. Each physical erasing unit has a plurality of physical programming units, and the physical programming units of the same physical erasing unit may be written separately and erased simultaneously. Additionally, each physical erasing unit is composed by 64 physical programming units, 256 physical programming units or any amount of the physical programming units.

More specifically, the physical erasing unit is a minimum unit for erasing. Namely, each physical erasing unit contains the least number of memory cells to be erased together. The physical programming unit is the minimum unit for programming. That is, the programming unit is the minimum unit for writing data. Each physical programming unit usually includes a data bit area and a redundancy bit area. The data bit area having multiple physical access addresses is used to store user data, and the redundant bit area is used to store system data (e.g., control information and error checking and correcting code). Herein, a capacity of one physical programming unit is defined as to include a capacity of the data bit area and a capacity of the redundancy bit area. For example, in the present exemplary embodiment, for each of the physical programming units, the capacity of the data bit area is 2 kilobyte (KB) and the capacity of the redundancy bit area is 64 byte. In other words, the data bit area of each physical programming unit contains 4 physical access addresses, and a size of each physical access address is 512 byte. Nevertheless, it should be understood that the invention is not limited thereto. For example, in other exemplary embodiments, the data bit area may also include more or less of the physical access addresses, and an amount and a size of the physical access addresses are not limited in the invention. For example, in an exemplary embodiment, the physical erasing unit is a physical block, and the physical programming unit is a physical page or a physical sector, but the invention is not limited thereto.

In the present exemplary embodiment, the rewritable non-volatile memory module 106 is a Multi Level Cell (MLC) NAND flash memory module (i.e., a flash memory module capable of storing two bits of data in one memory cell). However, the disclosure is not limited thereto. The rewritable non-volatile memory module 106 may also be a Single Level Cell (SLC) NAND flash memory module, (i.e., a flash memory module capable of storing one bit of data in one memory cell), a Trinary Level Cell (TLC) NAND flash memory module (i.e., a flash memory module capable of storing three bits of data in one memory cell), other flash memory modules or any memory module having the same features.

Figure 3:
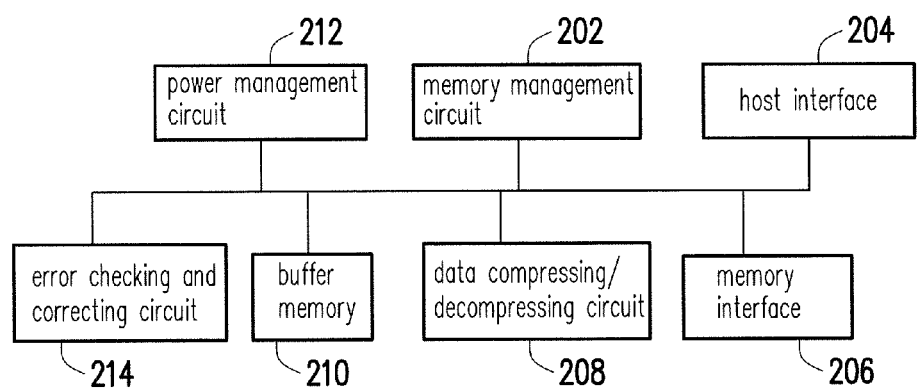
FIG. 3 is a schematic block diagram illustrating a memory control circuit unit according to the first exemplary embodiment.

FIG. 3 is a schematic block diagram illustrating a memory control circuit unit according to the first exemplary embodiment.

Referring to FIG. 3, the memory control circuit unit 104 includes a memory management circuit 202, a host interface 204, a memory interface 206 and a data compressing/decompressing circuit 208.

The memory management circuit 202 is configured to control overall operations of the memory control circuit unit 104. Specifically, the memory management circuit 202 has a plurality of control commands. When the memory storage apparatus 100 operates, the control commands are executed to issue a command sequence to the rewritable non-volatile memory module 106 in order to perform operations such as writing data into the rewritable non-volatile memory module 106, reading data from the rewritable non-volatile memory module 106 or erasing data on the rewritable non-volatile memory module 106.

In the present exemplary embodiment, the control commands of the memory management circuit 202 are implemented in a form of a firmware. For instance, the memory management circuit 202 has a microprocessor unit (not illustrated) and a ROM (not illustrated), and the control commands are burned into the ROM. When the memory storage apparatus 100 operates, the control commands are executed by the microprocessor to perform operations of writing, reading or erasing data.

In another exemplary embodiment of the invention, the control commands of the memory management circuit 202 may also be stored as program codes in a specific area (for example, the system area in a memory exclusively used for storing the system data) of the rewritable non-volatile memory module 106. In addition, the memory management circuit 202 has a microprocessor unit (not illustrated), the read only memory (not illustrated) and a random access memory (not illustrated). Particularly, the read only memory has an activate code, which is executed by the microprocessor unit to load the control commands stored in the rewritable non-volatile memory module 106 to the random access memory of the memory management circuit 202 when the memory control circuit unit 104 is enabled. Thereafter, the control commands are executed by the microprocessor unit to execute operations of writing, reading or erasing data.

Further, in another exemplary embodiment of the invention, the control commands of the memory management circuit 202 may also be implemented in a form of hardware. For example, the memory management circuit 202 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory management circuit is configured to manage the physical erasing units of the rewritable non-volatile memory module 106; the memory writing circuit is configured to issue a write command to the rewritable non-volatile memory module 106 in order to write data into the rewritable non-volatile memory module 106; the memory reading circuit is configured to issue a read command to the rewritable non-volatile memory module 106 in order to read data from the rewritable non-volatile memory module 106; the memory erasing circuit is configured to issue an erase command to the rewritable non-volatile memory module 106 in order to erase data from the rewritable non-volatile memory module 106; the data processing circuit is configured to process both the data to be written to the rewritable non-volatile memory module 106 and the data to be read from the rewritable non-volatile memory module 106.

The host interface 204 is coupled to the memory management circuit 202 and configured to couple to the connection interface unit 102, so as to receive and identify commands and data sent from the host system 1000. In other words, the commands and the data sent from the host system 1000 are passed to the memory management circuit 202 through the host interface 204. In the present exemplary embodiment, the host interface 204 is compatible with a SATA standard. However, it should be understood that the present invention is not limited thereto, and the host interface 204 may also be compatible with a PATA standard, an IEEE 1394 standard, a PCI Express standard, a USB standard, a UHS-I standard, a UHS-II standard, a SD standard, a MS standard, a MMC standard, a CF standard, an IDE standard, or other suitable standards for data transmission.

The memory interface 206 is coupled to the memory management circuit 202 and configured to access the rewritable non-volatile memory module 106. That is, data to be written to the rewritable non-volatile memory module 106 is converted to a format acceptable to the rewritable non-volatile memory module 106 through the memory interface 206.

The data compressing/decompressing circuit 208 is coupled to the memory management circuit 202. Herein, the data compressing/decompressing circuit 208 is configured to compress the data to be written into the rewritable non-volatile memory module 106 and configured to decompress the data read from the rewritable non-volatile memory module 106. For example, the data compressing/decompressing circuit 208 includes a compressor and a decompressor. The compressor is configured to locate a data redundancy existed in original data, remove the located data redundancy, and encode the rest of necessary data and then output an encoded result (i.e., a compressed data). The decompressor is configured to decode the read compressed data according to given steps and output a decoded result (i.e., a decompressed data). In the present exemplary embodiment, the data compressing/decompressing circuit 208 compresses data by using a lossless compression algorithm, so that the compressed data may be restored later.

In an exemplary embodiment of the invention, the memory control circuit unit 104 further includes a buffer memory 210, a power management circuit 212 and an error checking and correcting circuit 214.

The buffer memory 210 is coupled to the memory management circuit 202 and configured to temporarily store data and commands from the host system 1000 or data from the rewritable non-volatile memory module 106.

The power management unit 212 is coupled to the memory management circuit 202 and configured to control a power of the memory storage apparatus 100.

The error checking and correcting circuit 214 is coupled to the memory management circuit 202 and configured to perform an error checking and correcting process to ensure the correctness of data. Specifically, when the memory management circuit 202 receives a write command from the host system 1000, the error checking and correcting circuit 214 generates an error checking and correcting code (ECC code) for data corresponding to the write command, and the memory management circuit 202 writes data and the error checking and correcting code corresponding to the write command to the rewritable non-volatile memory module 106. Subsequently, when the memory management circuit 202 reads the data from the rewritable non-volatile memory module 106, the error checking and correcting code corresponding to the data is also read, and the error checking and correcting circuit 214 may execute the error checking and correcting procedure for the read data according to the error checking and correcting code.

It is worth mentioning that, a number of the error bits that can be corrected by the error checking and correcting circuit 214 is proportional to a size of the error checking and correcting circuit being generated. In other words, when the number of the error bits that can be corrected by the error checking and correcting circuit 214 is designed to be more, more of storage spaces are required to store the error checking and correcting codes being generated. However, the capacity of the redundancy bit area for storing the error checking and correcting codes is fixed (and may be different based on different types of the rewritable non-volatile memory modules). Therefore, an error correction algorithm implemented in the error checking and correcting circuit 214 may be restricted by the type of the rewritable non-volatile memory module 106. Specifically, the error checking and correcting circuit 214 is designed to correct a number of error bits (hereinafter, also known as a maximum correctable number of error bits). For example, the maximum correctable number of error bits is 48. If the number of error bits occurred in the read data is not greater than 48, the error checking and correcting circuit 214 is capable of correcting the error bits back to correct values according to the error checking and correcting code. Otherwise, the error checking and correcting circuit 214 reports that an error correction fails, and the memory management circuit 202 transmits a message indicating that the data has lost to the host system 1000.

Figure 4A:
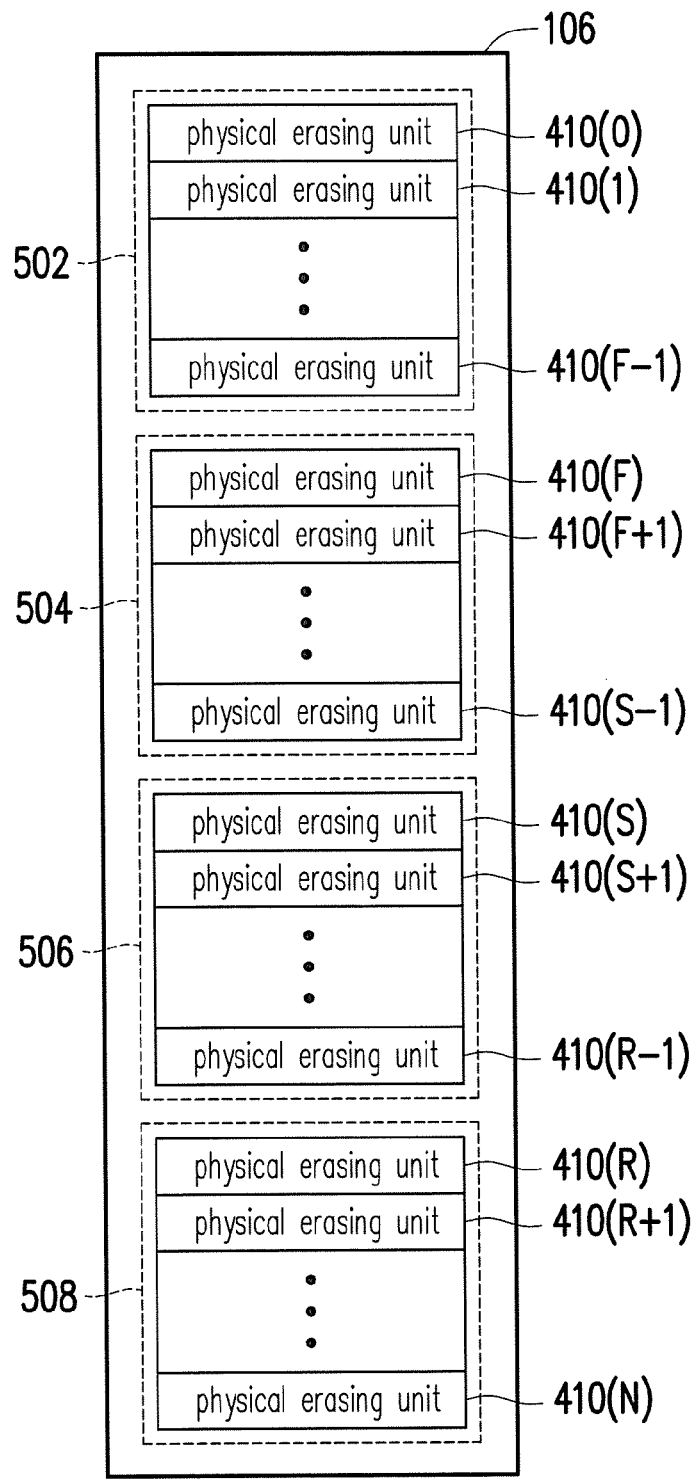
FIG. 4A and FIG. 4B are schematic diagrams illustrating a management of physical erasing units according to first exemplary embodiment.
Figure 4B:
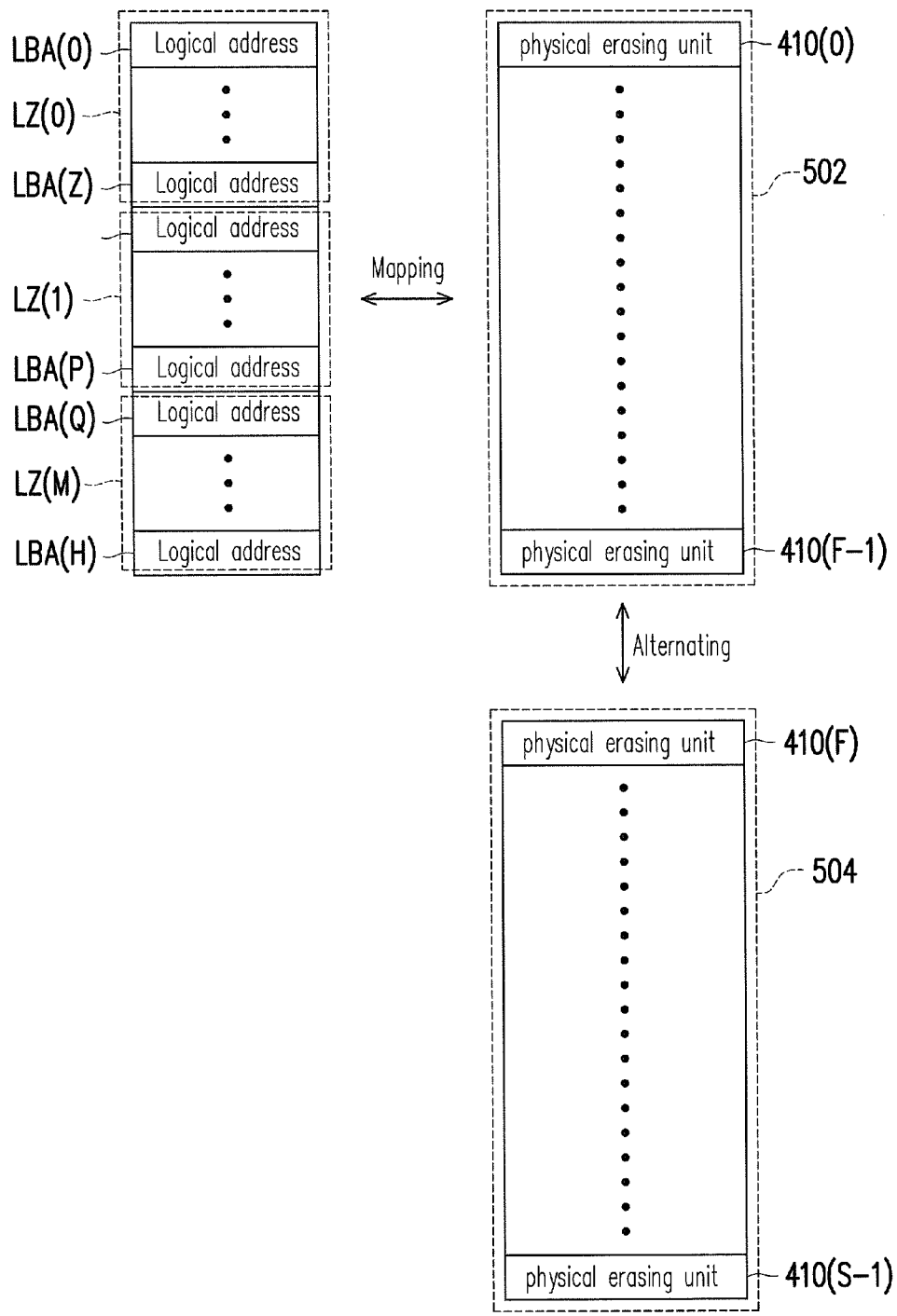

FIG. 4A and FIG. 4B are schematic diagrams illustrating a management of physical erasing units according to first exemplary embodiment.

It should be understood that terms, such as "retrieve", "group", "divide", "associate" and so forth, are logical concepts which describe operations in the physical erasing units of the rewritable non-volatile memory module 106. That is, the physical erasing units of the rewritable non-volatile memory module are logically operated, but actual positions of the physical units of the rewritable non-volatile memory module are not changed.

Referring to FIG. 4A, the memory control circuit unit 104 (or the memory management circuit 202) may logically group the physical erasing units 410(0) to 410(N) into a data area 502, a spare area 504, a system area 506 and a replacement area 508.

The physical erasing units logically belonging to the data area 502 and the spare area 504 are configured to store data from the host system 1000. More specifically, the physical erasing units of the data area 502 are regarded as the physical erasing units stored with the data, whereas the physical erasing units of the spare area 504 are configured to replace the physical erasing units of the data area 502. In other words, when the write command and the data to be written are received from the host system 1000, the memory control circuit unit 104 (or the memory management unit 202) retrieves the physical erasing units from the spare area 504, and writes the data into the selected physical erasing units in order to replace the physical erasing units in the data area 502.

The physical erasing units logically belonging to the system area 506 are configured to record the system data. For example, the system data includes information related to manufacturer and model of the rewritable non-volatile memory module, a number of physical erasing units in the rewritable non-volatile memory module, a number of the physical programming units in each physical erasing unit, and so forth.

The physical erasing units logically belonging to the replacement area 508 are used in a bad physical erasing unit replacement procedure for replacing damaged physical erasing units. More specifically, if available physical erasing units are still present in the replacement area 508 when the physical erasing units of the data area 502 are damaged, the memory control circuit unit 104 (or the memory management unit 202) retrieves the available physical erasing units from the replacement area 508 for replacing the damaged physical erasing units.

Particularly, the numbers of the physical erasing units in the data area 502, the spare area 504, the system 506 and the replacement area 508 may be different from one another according to the different memory specifications. In addition, it should be understood that, during operations of the memory storage apparatus 100, grouping relations of the physical erasing units for associating with the data area 502, the spare area 504, the system area 506, and replacement area 508 may be dynamically changed. For example, when the damaged physical erasing units in the spare area 504 are replaced by the physical erasing units in the replacement area 508, the physical erasing units originally from the replacement area 508 are then associated with the spare area 504.

Referring to FIG. 4B, the memory control circuit unit 104 (or the memory management circuit 202) may be disposed with logical addresses LBA(0) to LBA(H) for mapping to the physical erasing units of the data area 502, in which each of the logical addresses includes a plurality of logical sub-units for mapping to the corresponding physical programming units of the physical erasing units. Further, when the host system 1000 intends to write the data into the logical addresses or update the data stored in the logical addresses, the memory control circuit unit 104 (or the memory management unit 202) retrieves one physical erasing units from the spare area 504 for writing the data as an alternately exchange of the physical erasing units of the data area 502. In this exemplary embodiment, the logical sub-units may be logical pages or logical sectors.

In order to identify data belonging to each of the logical addresses is stored in which of the physical erasing units, in the present exemplary embodiment, the memory control circuit unit 104 (or the memory management circuit 202) may record the mapping relations between the logical addresses and the physical erasing units. Further, when the host system 1000 intends to access the data in the logical sub-unit, the memory control circuit unit 104 (or the memory management circuit 202) first confirms the logical address to which the logical sub-unit belongs, and access the data in the physical erasing units mapped to said logical address. For example, in the present exemplary embodiment, the memory control circuit unit 104 (or the memory management circuit 202) may store a logical-to-physical address mapping table into the rewritable non-volatile memory module 106 for recording the physical erasing units mapped to each of the logical addresses, and the logical-to-physical address mapping table are loaded into the buffer memory 210 for maintenance when the memory control circuit unit 104 (or the memory management circuit 202) intends to the access the data.

It should be noted that, the mapping table cannot record the mapping relation for all of the logical addresses because a capacity of the buffer memory 210 is limited. Therefore, in the present exemplary embodiment, the memory control circuit unit 104 (or the memory management unit 202) groups the logical addresses LBA(0) to LBA(H) as a plurality of logical zones LZ(0) to LZ(M), and disposes one logical-to-physical address mapping table for each of the logical zones. Particularly, when the memory control circuit unit 104 (or the memory management unit 202) intends to update the mapping table for one specific logical address, the logical-to-physical address mapping table corresponding to the logical zone to which the logical address belongs is loaded into the buffer memory 210 for updating.

Figure 5:
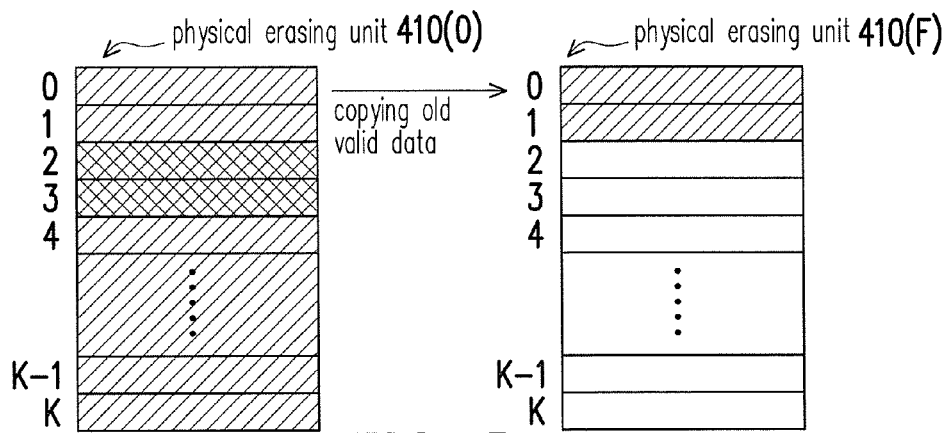
FIG. 5 to FIG. 7 illustrate an example of writing data into the rewritable non-volatile memory module according to the first exemplary embodiment.
Figure 6:
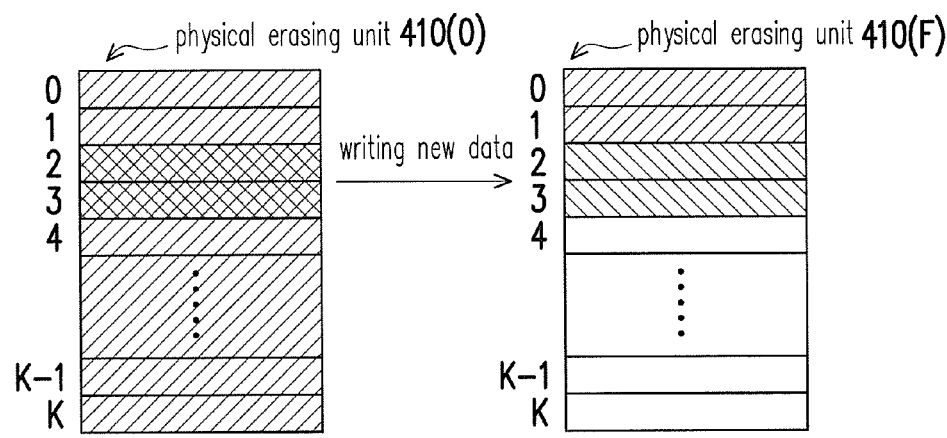
Figure 7:
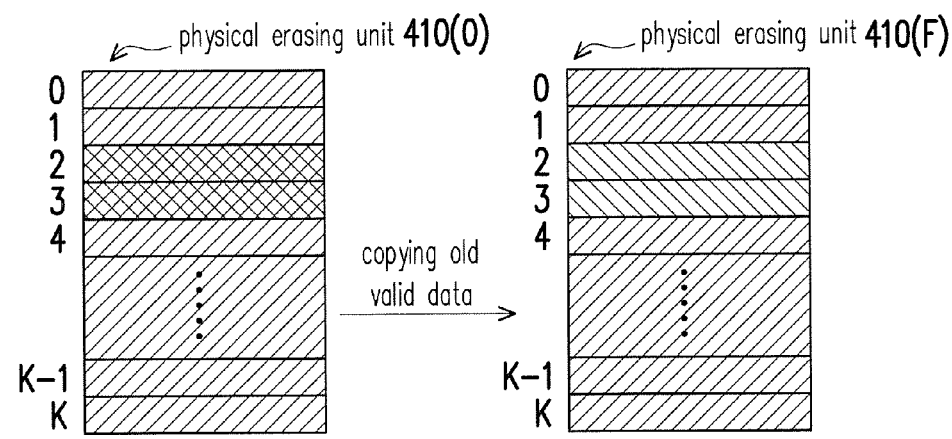

FIG. 5 to FIG. 7 illustrate an example of writing data into the rewritable non-volatile memory module according to the first exemplary embodiment.

Referring to FIG. 5 to FIG. 7, in the present exemplary embodiment, the management of the rewritable non-volatile memory module 106 of the memory storage apparatus 100 is performed based on the physical erasing units (which is also referred to as block-based management). Specifically, in a case where the logical address LBA(0) is mapped to the physical erasing unit 410(0), when the memory control circuit unit 104 (or the memory management circuit 202) receives a write command from the host system 1000 and accordingly is about to write data into a logical access address belonging to the logical address LBA(0), the memory control circuit unit 104 (or the memory management circuit 202) may identify that the logical address LBA(0) is currently mapped to the physical erasing unit 410(0) according to the logical address-physical address mapping table and select the physical erasing unit 410(F) from the spare area 504 as a substitution physical erasing unit to alternate with the physical erasing unit 410(0). However, while writing new data into the physical erasing unit 410(F), the memory control circuit unit 104 (or the memory management circuit 202) does not instantly move all the valid data from the physical erasing unit 410(0) to the physical erasing unit 410(F) to erase the physical erasing unit 410(0). To be specific, the memory control circuit unit 104 (or the memory management circuit 202) may copy the valid data before the physical programming units for writing the data in the physical erasing unit 410(0) (i.e., data in the $0^{th}$ and the $1^{st}$ physical programming units of the physical erasing unit 410(0)) to the $0^{th}$ and the $1^{st}$ physical programming units of the physical erasing unit 410(F) (as shown in FIG. 5), and write the new data to the $2^{nd}$ and the $3^{rd}$ physical programming units of the physical erasing unit 410(F) (as shown in FIG. 6). Herein, the memory control circuit unit 104 (or the memory management circuit 202) completes the data writing operation. Because the valid data in the physical erasing unit 410(0) may become invalid in a next operation (for example, a write command), instantly moving all the valid data from the physical erasing unit 410(0) to the physical erasing unit 410(F) may become meaningless. In addition, since data has to be sequentially written into the physical programming units of a physical erasing unit, the memory control circuit unit 104 (or the memory management circuit 202) may only move the valid data before the physical programming unit for writing the data.

In the present exemplary embodiment, the operation for maintaining such a temporary mother-child relationship (i.e., the relationship between the physical erasing unit 410(0) and the physical erasing unit 410(F)) is referred to as opening mother-child units, in which the original physical erasing unit is referred to as a mother physical erasing unit, while the substitution physical erasing unit is referred to as a child physical erasing units.

Subsequently, when the data in the physical erasing unit 410(0) and the physical erasing unit 410(F) is to be merged, the memory control circuit unit 104 (or the memory management circuit 202) combines the data in the physical erasing unit 410(0) and the physical erasing unit 410(F) together into a single physical erasing unit, such that the efficiency in using the physical erasing units can be improved. In this case, Herein the operation for merging the mother-child units is referred to as a data merging procedure or closing mother-child blocks. For example, as shown in FIG. 7, while closing the mother-child units, the memory control circuit unit 104 (or the memory management circuit 202) may copy the remaining valid data in the physical erasing unit 410(0) (i.e., data in the $4^{th}$ to the $(K)^{th}$ physical programming units in the physical erasing unit 410(0)) to the $4^{th}$ to the $(K)^{th}$ physical programming units in the substitution physical erasing unit 410(F). Then, the memory control circuit unit 104 (or the memory management circuit 202) may erase the physical erasing unit 410(0), associate the physical erasing unit 410(0) with the spare area 504, and simultaneously associate the physical erasing unit 410(F) with the data area 502. In other words, the memory control circuit unit 104 (or the memory management circuit 202) may re-map the logical address LBA(0) to the physical erasing unit 410(F) in the logical address-physical address mapping table. Additionally, in the present exemplary embodiment, the memory control circuit unit 104 (or the memory management circuit 202) may establish a spare area physical erasing unit table (not shown) to record the physical erasing units that are currently associated to the spare area. It should be mentioned that the number of the physical erasing units is limited in the spare area 504. Accordingly, during the operation of the memory storage apparatus 100, the number of the mother-child unit sets being opened is also limited. Thus, when the memory storage apparatus 100 receives a write command from the host system 1000, if the number of opened mother-child units has reached its upper limit, the memory control circuit unit 104 (or the memory management circuit 202) needs to close at least one set of mother-child blocks (i.e., perform the operation of closing mother-child units) before it executes the write command. Herein, the writing operation illustrated in FIG. 5 to FIG. 7 is referred to as a normal write mode.

It should be noted that in another exemplary embodiment, the management of the rewritable non-volatile memory module 106 of the memory storage apparatus 100 may also be performed based on the physical programming units (which is also referred to as page-based management), which is not limited in the present invention. For example, in the execution of the write command, no matter which logical sub-unit of a logical unit the data is currently about to be written into, the memory control circuit unit 104 (or the memory management circuit 202) may write data in a manner of one physical programming unit following another physical programming unit (which is referred to as a random writing mechanism hereinafter). Specifically, the memory control circuit unit 104 (or the memory management circuit 202) may select an empty physical erasing unit from the spare area 504 to serve it as a currently active physical erasing unit to write data. Meanwhile, when the currently active physical erasing unit is full, the memory control circuit unit 104 (or the memory management circuit 202) may further select another empty physical erasing unit from the spare area 504 to serve it as the currently active physical erasing unit to continuously write the data corresponding to the write command from the host system 1000.

In the present exemplary embodiment, after the write command and the data corresponding to the write command are received from the host system 1000, the memory control circuit unit 104 (or the memory management circuit 202) writes the received data into the rewritable non-volatile memory module 106 by using the physical programming unit as a unit. Particularly, the memory control circuit unit 104 (or the memory management circuit 202) generates an error checking and correcting code frame (ECC frame) according to the received data and the error checking and correcting code, and writes the error checking and correcting code frame into the rewritable non-volatile memory module 106. For example, in the present exemplary embodiment, a length of the user data included in one error checking and correcting code frame is 2K, and one physical programming unit is capable of storing one error checking and correcting code frame. Nevertheless, it should be understood that the invention is not limited thereto. In another exemplary embodiment of the invention, the length of the user data included in one error checking and correcting code frame may also be 512 byte or 1K. In other words, one physical programming unit is capable of storing multiple error checking and correcting code frames.

Figure 8:
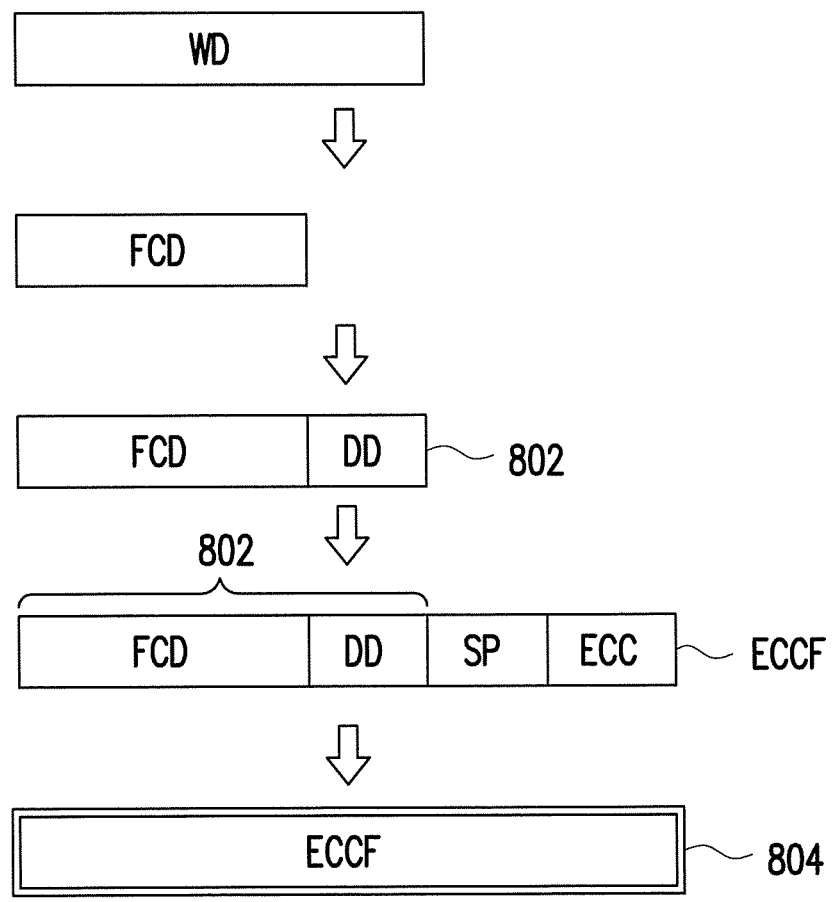
FIG. 8 illustrates a schematic diagram of writing data into the physical programming unit according to the first exemplary embodiment.

FIG. 8 illustrates a schematic diagram of writing data into the physical programming unit according to the first exemplary embodiment.

Referring to FIG. 8, in the present exemplary embodiment, when the memory control circuit unit 104 (or the memory management circuit 202) receives a write command from the host system 1000, and the write command instructs to write writing data WD into one specific logical address, the memory control circuit unit 104 (or the data compressing/decompressing circuit 208) fills dummy data DD into data FCD (hereinafter, also known as first data FCD) corresponding to the writing data WD in order to generate data 802 (hereinafter, also known as second data 802). Herein, the second data 802 is also known as the user data. Particularly, in the present exemplary embodiment, the first data FCD is the compressed data generated by the memory control circuit unit 104 (or the data compressing/decompressing circuit 208) compressing the writing data WD. However, the invention is not limited thereto. For example, in another exemplary embodiment, the first data FCD is the writing data WD not being compressed.

Particularly, in the present exemplary embodiment, the memory control circuit unit 104 (or the data compressing/decompressing circuit 208) fills the dummy data DD behind the last bit of the first data FCD in order to generate the second data 802. It is worth mentioning that, although the dummy data DD is filled behind the first data FCD in the present exemplary embodiment, it should be understood that the invention is not limited to the above. For example, in another exemplary embodiment, the dummy data DD may also be placed in front of the first data FCD.

Next, the memory control circuit unit 104 (or the error checking and correcting circuit 214) generates an error checking and correcting code ECC corresponding to the second data 802, and the memory control circuit unit 104 (or the memory management circuit 202) generates management information SP (e.g., the logical address to which the data belongs, etc.) corresponding to the second data 802. Thereafter, the memory control circuit unit 104 (or the memory management circuit 202) generates an error checking and correcting code frame ECCF according to the second data 802, the management information SP and the error checking and correcting code ECC.

Specifically, the memory control circuit unit 104 (or the data compressing/decompressing circuit 208) uses the lossless compression algorithm to compress the data. However, sizes of the compressed data generated by compressing the different writing data WD may be different. In the present exemplary embodiment, the rewritable non-volatile memory module 106 is written by using the physical programming unit as a unit, and one physical programming unit is capable of storing one error checking and correcting code frame. Therefore, in the present exemplary embodiment, the memory control circuit unit 104 (or the memory management circuit 202) uses the dummy data DD to fill the first data FCD, such that a size of the error checking and correcting code frame ECCF is identical to a size of one physical programming unit. For example, if the compressed data having the size of 1.8 KB is generated by compressing the writing data having the size of 2 KB, the memory control circuit unit 104 (or the memory management circuit 202) uses the dummy data DD having the size of 0.2 KB to fill the first data FCD in order to generate the second data 802, so as to maintain an amount of the data programmed to the data bit area at 2 KB. Herein, the dummy data DD has a plurality of data bits, and a value of each data bit is of the same value (hereinafter, also known as a first value). For example, the first value is "F", but the present invention is not limited thereto. Each data bit of the dummy data DD may be other characters.

Thereafter, the memory control circuit unit 104 (or the memory management circuit 202) writes the error checking and correcting code frame ECCF into a first physical programming unit 804 among the physical programming units. That is, the first data FCD and the dummy data DD (i.e., the second data) are written into the data bit area of the first physical programming unit 804, and the error checking and correcting code ECC is written into the redundancy bit area of the first physical programming unit 804. Further, the memory control circuit unit 104 (or the memory management circuit 202) maps aforesaid logical address to the first physical programming unit 804.

Figure 9:
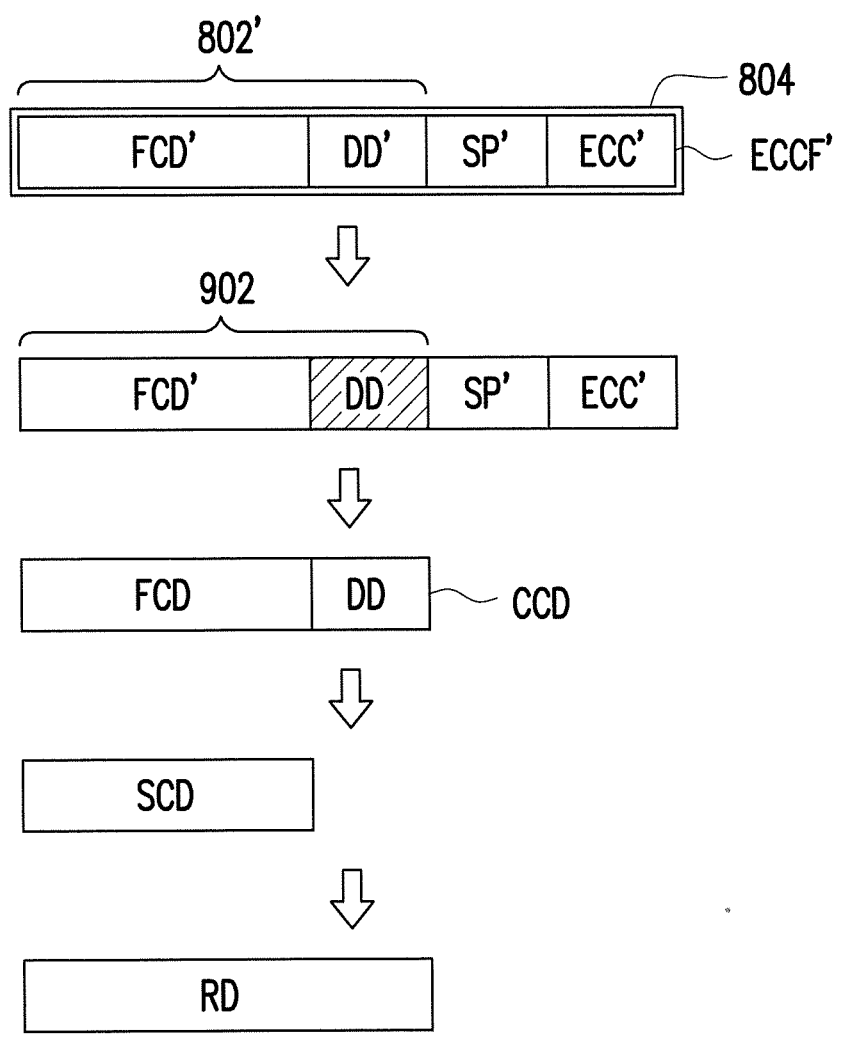
FIG. 9 illustrates a schematic diagram of reading data from the physical programming unit according to the first exemplary embodiment.

FIG. 9 illustrates a schematic diagram of reading data from the physical programming unit according to the first exemplary embodiment.

Referring to FIG. 9, as a continuation to the example in FIG. 8, when the memory control circuit unit 104 (or the memory management circuit 202) receives a read command from the host system 1000 and the read command instructs to read the data stored in the first physical programming unit 804 (i.e., the writing data WD being written previously) from the logical address corresponding to the first physical programming unit 804, the memory control circuit unit 104 (or the memory management circuit 202) reads an error checking and correcting code frame ECCF' from the first physical programming unit 804 in order to obtain a reading data stream. Therein, the reading data stream includes data 802' (hereinafter, also known as third data), management information SP' and an error checking and correcting code ECC'. The third data 802' includes data FCD' and data DD'.

Specifically, the memory control circuit unit 104 (or the memory management circuit 202) uses the error checking and correcting code ECC' to correct the third data 802' in order to obtain a corrected data. In the present exemplary embodiment, when the third data 802' cannot be corrected by using the error checking and correcting code ECC' in order to obtain the corrected data, the memory control circuit unit 104 (or the memory management circuit 202) adjusts the third data 802' according to a pattern of the dummy data being written previously in order to generate fourth data 902, and the error checking and correcting circuit 214 uses the error checking and correcting code ECC' to correct the fourth data 902 in order to obtain corrected data CCD. Particularly, because the memory control circuit unit 104 (or the memory management circuit 202) writes the second data 802 into the first physical programming unit 804, the corrected data CCD is identical to the second data 802.

Next, the memory control circuit unit 104 (or the memory management circuit 202) removes the dummy data DD from the corrected data CCD in order to obtain compressed data SCD (hereinafter, also known as fifth data SCD), and decompress the fifth data SCD in order to obtain reading data RD. Herein, the reading data RD is identical to the writing data WD. Thereafter, the memory control circuit unit 104 (or the memory management circuit 202) transmits the reading data RD to the host system 1000 in response to the read command.

Figure 10A:
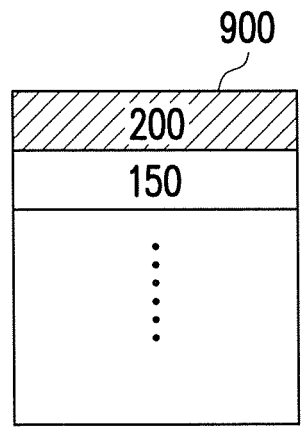
FIG. 10A illustrates an example of recording the pattern of the dummy data into the dummy data entry table according to the first exemplary embodiment.

FIG. 10A illustrates an example of recording the pattern of the dummy data into the dummy data entry table according to the first exemplary embodiment.

Referring to FIG. 10A, in the present exemplary embodiment, the memory control circuit unit 104 (or the memory management circuit 202) records the pattern of the dummy data corresponding to the first physical programming unit 804 into a dummy data entry table 900. Accordingly, when the memory control circuit unit 104 (or the error checking and correcting circuit 214) cannot correct the read third data 802' by using the error checking and correcting circuit ECC' in order to obtain the corrected data, the memory control circuit unit 104 (or the memory management circuit 202) may adjust the third data 802' according to the pattern of the dummy data recorded in the dummy data entry table. For instance, the memory control circuit unit 104 (or the memory management circuit 202) stores and records the number of data bits filled for generating the second data 802. In other words, the memory management circuit 202 records the pattern of the dummy data as a length of the dummy data DD. For example, in the present exemplary embodiment, the memory control circuit unit 104 (or the memory management circuit 202) records the length of the dummy data DD as 200 byte (i.e., 0.2 KB) and stores the same in the dummy data entry table 900. However, in another exemplary embodiment, the pattern of the dummy data may be a physical address where a first data bit in the dummy data DD is located, which is not particularly limited in the invention. In addition, the dummy data entry table is, for example, stored in the physical erasing unit for storing the system data in the rewritable non-volatile memory module 106, or stored in the buffer memory 210, which are not particularly limited in the invention.

Figure 10B:
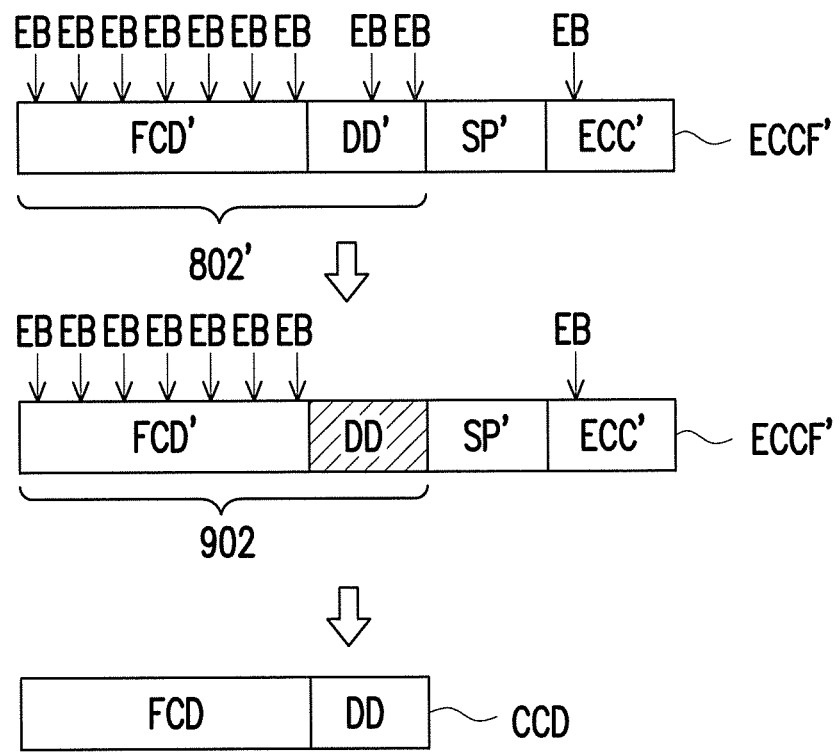
FIG. 10B illustrates an example of adjusting the read data by using the pattern of the dummy data to improve a correction capability of the error checking and correcting code according to the first exemplary embodiment.

FIG. 10B illustrates an example of adjusting the read data by using the pattern of the dummy data to improve a correction capability of the error checking and correcting code according to the first exemplary embodiment.

Referring to FIG. 10B, during a reading process, the error correction is performed on the not yet corrected third data 802' by using the read error checking and correcting code ECC'. Herein, because the number of error bits EB in the third data 802' and the error checking and correcting code ECC' is 10, the number of the error bits occurred in the read data is greater than a maximum correctable number of error bits (herein, it is assumed to be 8). That is to say, the third data 802' cannot be corrected by using the error checking and correcting code ECC' in order to obtain the corrected data CCD in this case. Herein, the memory control circuit unit 104 (or the memory management circuit 202) reads the dummy data entry table 900, identifies the length (i.e., 200 byte) of the dummy data DD corresponding to the first physical programming unit 804 according to the dummy data entry table 900, and replaces the last 200 byte arranged at last of the third data 802' by the dummy data DD in order to obtain the fourth data 902 according to the length of the dummy data DD corresponding to the first physical programming unit 804. Particularly, a length of the data bits (i.e., 200 byte) arranged at last of the third data 802' is equal to the length of the dummy data DD. Therefore, the error checking and correcting circuit 214 may still successfully use the error checking and correcting code ECC' to correct the not yet corrected third data 802', and restore the third data 802' back to the second data 802. Specifically, 2 of the error bits EB among 10 of the error bits depicted in FIG. 10B occur in the data DD', and the data DD' has been adjusted and corrected to be the dummy data DD in aforesaid operation. Accordingly, the fourth data 902 (i.e., the adjusted third data 802') and the error checking and correcting code ECC' now only includes 8 of the error bits EB. Therefore, the number the error bits to be corrected does not exceed a number of the error bits that the error checking and correcting circuit 214 is capable of performing the error correction to. In other words, the error checking and correcting circuit 214 may use the error checking and correcting code to correct the fourth data 902 in order to obtain the corrected data CCD, and the corrected data CCD (as shown in FIG. 10B) is identical to the second data 802 (as shown in FIG. 8), such that the corrected data CCD may also be successfully decompressed in order to obtain the reading data RD (i.e., the writing data WD originally being written).

Figure 11A:
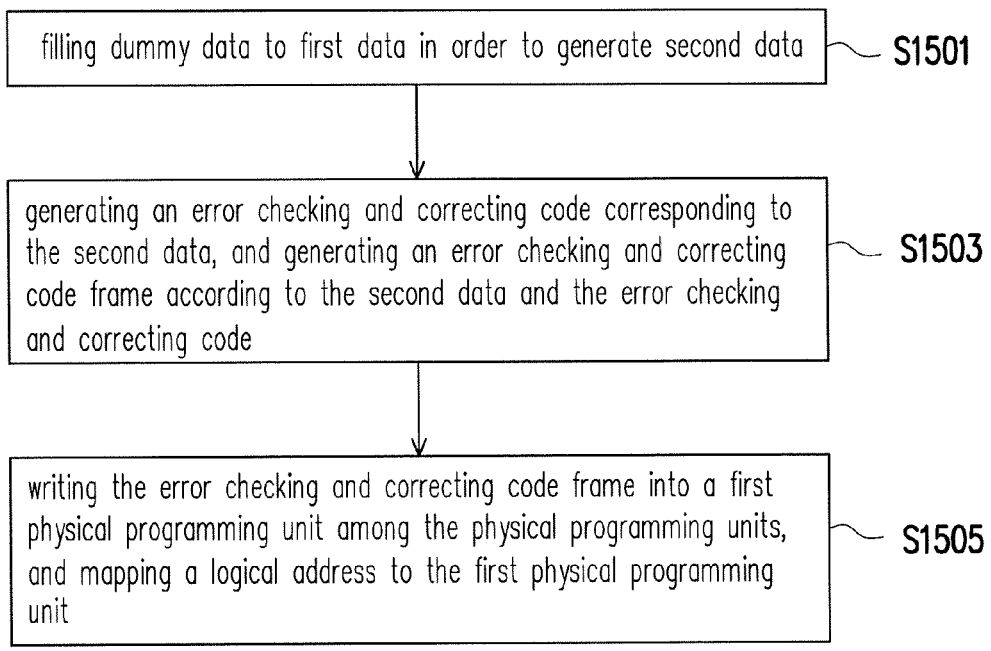
FIG. 11A is a flowchart of a data writing method according to the first exemplary embodiment.

FIG. 11A is a flowchart of a data writing method according to the first exemplary embodiment.

Referring to FIG. 11A, in step S1501, the memory control circuit unit 104 (or the data compressing/decompressing circuit 214) fills dummy data to first data in order to generate second data.

Subsequently, in step S1503, the memory control circuit unit 104 (or the error checking and correcting circuit 214) generates an error checking and correcting code corresponding to the second data, and generates an error checking and correcting code frame according to the second data and the error checking and correcting code.

Thereafter, in step S1505, the memory control circuit unit 104 (or the memory management circuit 202) writes the error checking and correcting code frame into a first physical programming unit among the physical programming units, and maps a logical address to the first physical programming unit.

Figure 11B:
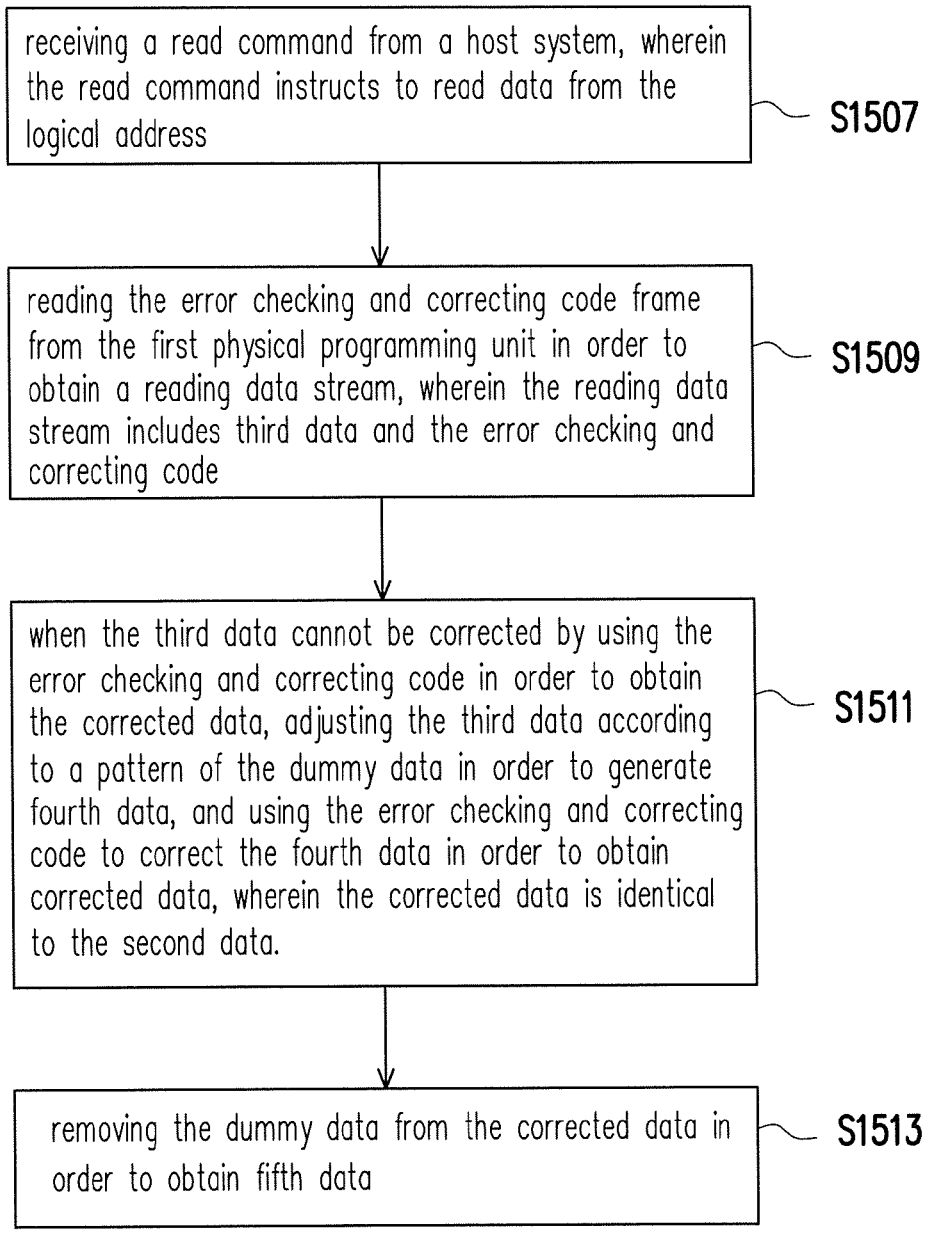
FIG. 11B is a flowchart of a data reading method according to the first exemplary embodiment.

FIG. 11B is a flowchart of a data reading method according to the first exemplary embodiment.

Referring to FIG. 11B, in step S1507, the memory control circuit unit 104 (or the memory management circuit 202) receives a read command from a host system, and the read command instructs to read data from the logical address.

In step S1509, the memory control circuit unit 104 (or the memory management circuit 202) reads the error checking and correcting code frame from the first physical programming unit in order to obtain a reading data stream, wherein the reading data stream includes third data and the error checking and correcting code.

Subsequently, in step S1511, when the third data cannot be corrected by using the error checking and correcting code in order to obtain the corrected data, the memory control circuit unit 104 (or the memory management circuit 202) adjusts the third data according to a pattern of the dummy data in order to generate fourth data, and the error checking and correcting circuit 214 uses the error checking and correcting code to correct the fourth data in order to obtain corrected data, wherein the corrected data is identical to the second data.

Thereafter, in step S1513, the memory control circuit unit 104 (or the memory management circuit 202) removes the dummy data from the corrected data in order to obtain fifth data.

Second Exemplary Embodiment

A hardware structure of a memory storage apparatus of the second exemplary embodiment is essentially identical to a hardware structure of the memory storage apparatus of the first exemplary embodiment, and a difference between the two is that, the memory storage apparatus of the first exemplary embodiment records the pattern of the dummy data into the dummy data entry table and adjusts the read data by using the pattern of the dummy data in order to improve a correction capability of the error checking and correcting code, whereas the memory storage apparatus of the second exemplary embodiment records the pattern of dummy data into dummy data information corresponding to the writing data. Operations of the memory storage apparatus of the second exemplary embodiment are described in detail below by reference with the drawings and reference numbers of the memory storage apparatus of the first exemplary embodiment.

Figure 12:
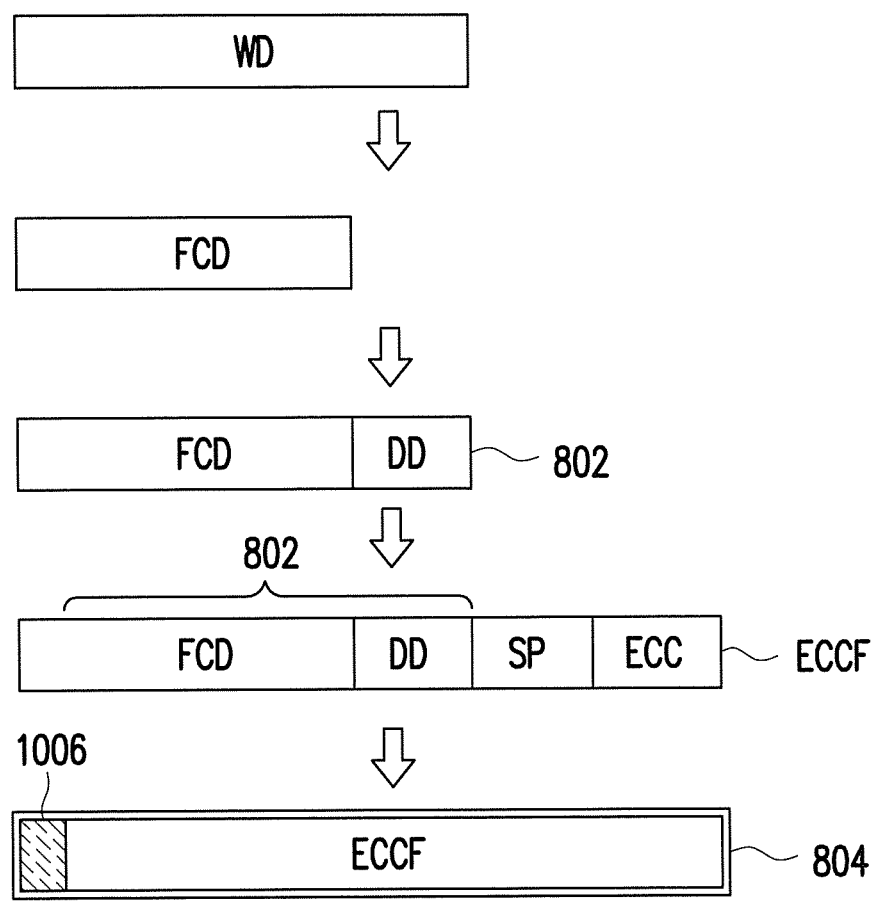
FIG. 12 illustrates a schematic diagram of writing data into the physical programming unit according to the second exemplary embodiment.

FIG. 12 illustrates a schematic diagram of writing data into the physical programming unit according to the second exemplary embodiment.

Referring to FIG. 12, methods of the memory control circuit unit 104 (or the memory management circuit 202) depicted in FIG. 12 for compressing the writing data WD in order to generate the first data FCD, filling the dummy data DD to the first data FCD in order to generate the second data 802, generating the error checking and correcting code frame ECCF according to the second data 802, the management information SP and the error checking and correcting code ECC and writing the error checking and correcting code frame ECCF into the first physical programming unit 804 are identical to the methods illustrated in FIG. 8 of the first exemplary embodiment, which are not repeated hereinafter. The difference is that, in the present exemplary embodiment, in the operation of the memory control circuit unit 104 (or the memory management circuit 202) for writing the error checking and correcting code frame ECCF into the first physical programming unit 804 among the physical programming units, the memory control circuit unit 104 (or the memory management circuit 202) writes dummy data information 1006 and the error checking and correcting code frame ECCF together into the first physical programming unit 804. Particularly, the dummy data information 1006 records the pattern of the dummy data corresponding to the first physical programming unit 804. Herein, the pattern of the dummy data is recorded as a length of the dummy data DD. For example, if the first data FCD having the size of 1.8 KB is generated by compressing the writing data WD having the size of 2 KB, the memory control circuit unit 104 (or the memory management circuit 202) uses the dummy data DD having the size of 0.2 KB to fill the first data FCD in order to generate the second data 802. Therefore, in the present exemplary embodiment, the memory control circuit unit 104 (or the memory management circuit 202) records the length of the dummy data DD as 200 byte (i.e., 0.2 KB) and stores the same in the dummy data information 1006 of the first physical programming unit 804.

Figure 13:
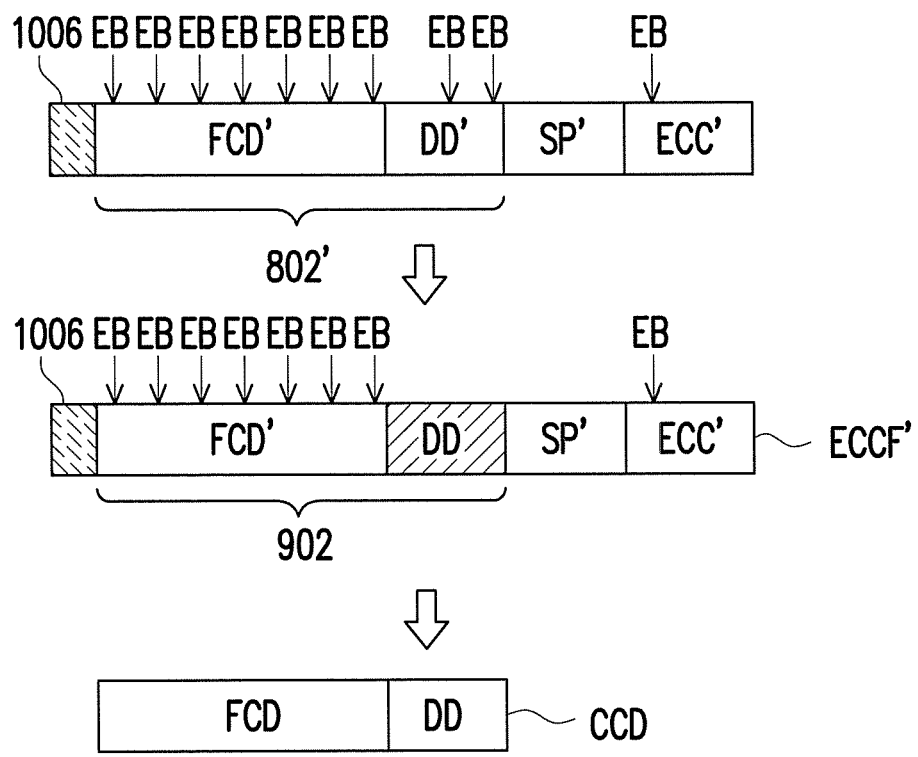
FIG. 13 illustrates an example of adjusting the read data by using the pattern of the dummy data to improve a correction capability of the error checking and correcting code according to the second exemplary embodiment.

FIG. 13 illustrates an example of adjusting the read data by using the pattern of the dummy data to improve a correction capability of the error checking and correcting code according to the second exemplary embodiment.

Referring to FIG. 13, during a reading process, the error correction is performed on the not yet corrected third data 802' by using the read error checking and correcting code ECC'. Herein, because a number of error bits EB in the third data 802' and the error checking and correcting code ECC' is 10, the number of the error bits occurred in the read data is greater than a maximum correctable number of error bits (herein, it is assumed to be 8). That is to say, the third data 802' cannot be corrected by using the error checking and correcting code ECC' in order to obtain the corrected data CCD in this case. Herein, the memory control circuit unit 104 (or the memory management circuit 202) reads the dummy data information 1006 from the first physical programming unit 804, identifies the length of the dummy data DD corresponding to the first physical programming unit 804 as 200 byte according to the dummy data information 1006, and replaces the last 200 bytes arranged at last of the third data 802' by the dummy data DD in order to obtain the fourth data 902 according to the length of the dummy data DD corresponding to the first physical programming unit 804. Particularly, a length of the data bits (i.e., 200 byte) arranged at last of the third data 802' is equal to the length of the dummy data DD. Therefore, the error checking and correcting circuit 214 may still successfully use the error checking and correcting code ECC' to correct the not yet corrected third data 802', and restore the third data 802' back to the second data 802. Specifically, 2 of the error bits EB among 10 of the error bits depicted in FIG. 13 occur in the data DD', and the data DD' has been adjusted and corrected to be the dummy data DD in aforesaid operation. Accordingly, the fourth data 902 (i.e., the adjusted third data 802') and the error checking and correcting code ECC' now only includes 8 of the error bits EB. Therefore, a number the error bits to be corrected does not exceed a number of the error bits that the error checking and correcting circuit 214 is capable of performing the error correction to. In other words, the error checking and correcting circuit 214 may use the error checking and correcting code to correct the fourth data 902 in order to obtain the corrected data CCD, and the corrected data CCD (as shown in FIG. 13) is identical to the second data 802 (as shown in FIG. 12), such that the corrected data CCD may also be successfully decompressed in order to obtain the reading data RD (i.e., the writing data WD originally being written).

Third Exemplary Embodiment

A hardware structure of a memory storage apparatus of the third exemplary embodiment is essentially identical to the hardware structure of the memory storage apparatus of the first exemplary embodiment, and a difference between the two is that, the memory storage apparatus of the third exemplary embodiment adjusts the read data by identifying a group of continuous data bits in the read data in order to improve a correction capability of the error checking and correcting code. Operations of the memory storage apparatus of the third exemplary embodiment are described in detail below by reference with the drawings and reference numbers of the memory storage apparatus of the first exemplary embodiment.

Figure 14A:
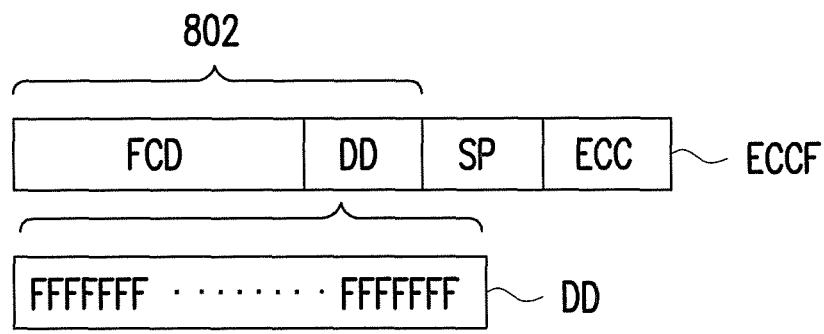
FIG. 14A and FIG. 14B illustrate an example of adjusting the read data by identifying a group of continuous data bits in the read data according to the third exemplary embodiment.
Figure 14B:
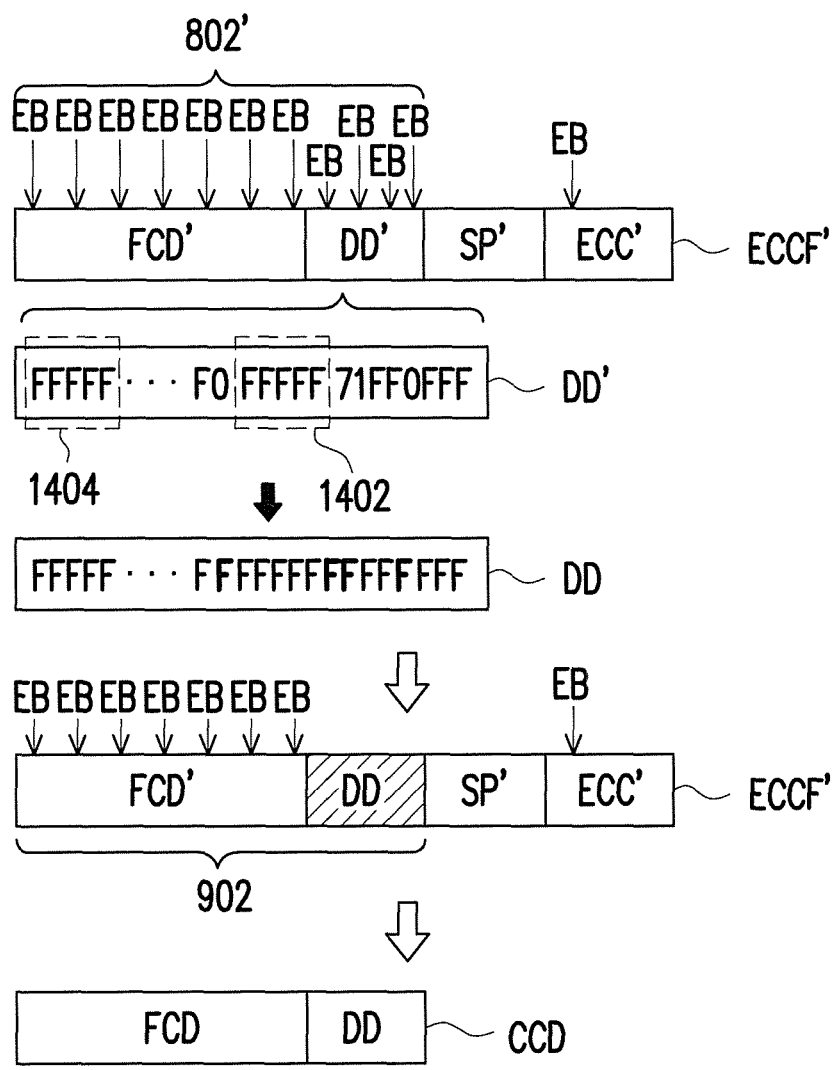

FIG. 14A and FIG. 14B illustrate an example of adjusting the read data by identifying a group of continuous data bits in the read data according to the third exemplary embodiment.

Referring to FIG. 14A, in the present exemplary embodiment, methods of the memory control circuit unit 104 (or the memory management circuit 202) for compressing the writing data in order to generate the first data FCD, filling the dummy data DD to the first data FCD in order to generate the second data 802, generating the error checking and correcting code frame ECCF according to the second data 802, the management information SP and the error checking and correcting code ECC, and writing the error checking and correcting code frame ECCF into the first physical programming unit 804 are identical to the methods illustrated in FIG. 8 of the first exemplary embodiment, which are not repeated hereinafter. It is worth mentioning that, if the compressed data having the size of 1.8 KB is generated by compressing the writing data having the size of 2 KB, the memory management circuit 202 uses the dummy data DD having the size of 0.2 KB to fill the generated second data 802, so as to maintain an amount of the data programmed to the data bit area at 2 KB. As described above, in the present exemplary embodiment, the memory control circuit unit 104 (or the memory management circuit 202) fills a plurality of data bits of the dummy data DD by a first value. The first value is "F" for example. However, the invention is not limited thereto. For example, in another exemplary embodiment, each data bit of the dummy data DD may be any value or character.

Referring to FIG. 14B, during a reading process, the error correction is performed on the not yet corrected third data 802' corresponding to the second data 802 by using the read error checking and correcting code ECC'. Herein, because the number of error bits EB in the third data 802' and the error checking and correcting code ECC' is 12, the number of the error bits occurred in the read data is greater than a maximum number of correctable error bits (herein, it is assumed to be 8). That is to say, the third data 802' cannot be corrected by using the error checking and correcting code ECC' in order to obtain the corrected data CCD in this case. Herein, the memory control circuit unit 104 (or the memory management circuit 202) scans each data bit of the third data 802' starting from the last data bit of the third data 802', and identifies a group of continuous data bits in the third data 802'. In the present exemplary embodiment, the memory management circuit 202 groups 5 continuous data bits into one group. When all of the 5 continuous data bits sequentially scanned are the first value (i.e., "F"), the 5 continuous data bits are regarded as a group of continuous data bits (i.e., "FFFFF"). Nonetheless, the present invention is not intended to limit the number of data bits in the group of continuous data bits. For example, in another exemplary embodiment, the number of data bits in the group continuous data bits may be set to 4 or more than 5.

In the present exemplary embodiment, the memory control circuit unit 104 (or the memory management circuit 202) replaces a value of at least one data bit arranged behind at least one group of continuous data bits being identified in the third data 802' by the first value (i.e., "F") in order to generate the fourth data. Specifically, the memory control circuit unit 104 (or the memory management circuit 202) searches each group of continuous data bits in the third data 802', and identifies that one group of continuous data bits arranged at the front and the data bits arranged thereafter are the dummy data. For example, the memory control circuit unit 104 (or the memory management circuit 202) first scans a first group of continuous data bits 1402. Then, the scanning continues until the last group of continuous data 1404 is scanned. Accordingly, it can be ensured that when the memory management circuit 202 replaces the value of the at least one data bit arranged behind the last group of continuous data bits 1404 in the third data 802' by the first value (i.e., "F"), each of the error bits may be replaced.

Thereafter, the error checking and correcting circuit 214 may use the error checking and correcting code ECC' to correct the fourth data 902 (which is obtained by adjusting the not yet corrected third data 802' according to the pattern of the dummy data) to be restored back to the second data 802. Specifically, 4 of the error bits EB among 12 of the error bits depicted in FIG. 14B occur in the data DD', and the data DD' has been adjusted and corrected to be the dummy data DD in aforesaid operation. Accordingly, the fourth data 902 (i.e., the adjusted third data 802') and the error checking and correcting code ECC' now only includes 8 of the error bits EB. Therefore, the number the error bits to be corrected does not exceed a number of the error bits that the error checking and correcting circuit 214 is capable of performing the error correction to. In other words, the error checking and correcting circuit 214 may use the error checking and correcting code ECC' to correct the fourth data 902 in order to obtain the corrected data CCD, and, as shown in FIG. 14A and FIG. 14B, the corrected data CCD is identical to the second data 802, such that the corrected data CCD may also be successfully decompressed in order to obtain the reading data RD (i.e., the writing data WD originally being written).

Fourth Exemplary Embodiment

A hardware structure of a memory storage apparatus of the fourth exemplary embodiment is essentially identical to the hardware structure of the memory storage apparatus of the first exemplary embodiment, and a difference between the two is that, the memory storage apparatus of the fourth exemplary embodiment adjusts the read data by identifying two different groups of continuous data bits in the read data in order to improve a correction capability of the error checking and correcting code. Operations of the memory storage apparatus of the fourth exemplary embodiment are described in detail below by reference with the drawings and reference numbers of the memory storage apparatus of the first exemplary embodiment.

Figure 15A:
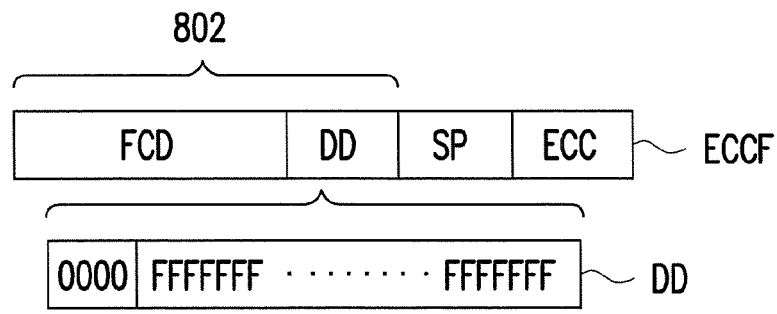
FIG. 15A and FIG. 15B illustrate an example of adjusting the read data by identifying two different groups of continuous data bits in the read data according to the fourth exemplary embodiment.
Figure 15B:
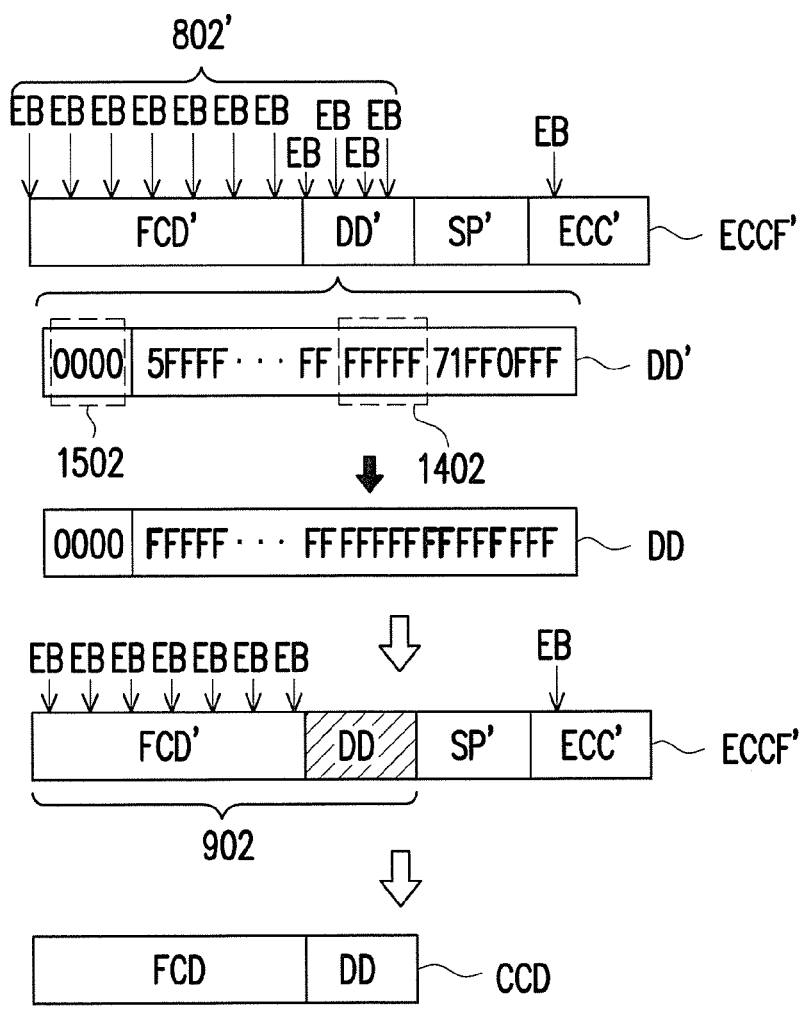

FIG. 15A and FIG. 15B illustrate an example of adjusting the read data by identifying two different groups of continuous data bits in the read data according to the fourth exemplary embodiment.

Referring to FIG. 15A, in the present exemplary embodiment, methods of the memory control circuit unit 104 (or the memory management circuit 202) for compressing the writing data in order to generate the first data FCD, filling the dummy data DD to the first data FCD in order to generate the second data 802, generating the error checking and correcting code frame ECCF according to the second data 802, the management information SP and the error checking and correcting code ECC, and writing the error checking and correcting code frame ECCF into the first physical programming unit 804 are identical to the methods illustrated in FIG. 8 of the first exemplary embodiment, which are not repeated hereinafter. It is worth mentioning that, if the compressed data having the size of 1.8 KB is generated by compressing the writing data having the size of 2 KB, the memory management circuit 202 uses the dummy data DD having the size of 0.2 KB to fill the generated second data 802, so as to maintain an amount of the data programmed to the data bit area at 2 KB. Particularly, in the present exemplary embodiment, the memory management circuit 202 fills a plurality of data bits of the dummy data DD by a first value, and further fills a group of second values in front of these first values. Herein, the first value is "F" while the second value is "0" for example. However, the present invention is not limited thereto. For example, in another exemplary embodiment, the first value and the second value may also be any other values or characters. It should be noted that, the first value is different from the second value.

Referring to FIG. 15B, during a reading process, the error correction is performed on the not yet corrected third data 802' by using the read error checking and correcting code ECC'. Herein, because a number of error bits EB in the third data 802' and the error checking and correcting code ECC' is 12, the number of the error bits occurred in the read data is greater than a maximum correctable number of error bits (herein, it is assumed to be 8). That is to say, the third data 802' cannot be corrected by using the error checking and correcting code ECC' in order to obtain the corrected data CCD in this case. In this case, the memory management circuit 202 scans each data bit of the third data 802' starting from the last data bit of the third data 802', and identifies a group of continuous data bits and another group of continuous data bits in the third data 802', and the groups of continuous data bits are not identical. In the present exemplary embodiment, the memory management circuit 202 groups 5 continuous data bits into one group. When all of the 5 continuous data bits sequentially scanned are the first value (i.e., "F"), the 5 continuous data bits are regarded as a group of continuous data bits (i.e., "FFFFF"). Nonetheless, the invention is not intended to limit a number of data bits in the group of continuous data bits. For example, in another exemplary embodiment, the number of data bits in the group continuous data bits may be set to 4 or more than 5. The memory management circuit 202 scans each data bit of the third data 802' starting from the last data bit of the third data 802'. Therefore, the memory control circuit unit 104 (or the memory management circuit 202) continues to scan another different group of continuous data bits, and all 4 data bits of this group of continuous data bits are the second value "0".

In the present exemplary embodiment, the memory management circuit 202 replaces a value of at least one data bit arranged behind the another group of continuous data bits being identified in the third data 802' (i.e., the group of continuous data bits having the continuous data bits being the second value) by the first value (i.e., "F"). Specifically, the memory management circuit 202 starts at last of the second data to scan forward the first group of continuous data bits 1402 or a plurality of continuous data bits having all the continuous data bits being the first value. Particularly, if the another group of continuous data bits 1502 having all the continuous data bits being the second value is found in front of the group of continuous data bits having all the continuous data bits being the first value, it indicates that this another group of continuous data bits 1502 and the data bits thereafter are the dummy data. Accordingly, the error bits in the data DD' may be correctly corrected to be the dummy data DD having all the data bits being the first value.

Thereafter, the error checking and correcting circuit 214 may use the error checking and correcting code ECC' to correct the fourth data 902 (which is obtained by adjusting the not yet corrected third data 802' according to the pattern of the dummy data) to be restored back to the second data 802. Specifically, 4 of the error bits EB among 12 of the error bits depicted in FIG. 15B occur in the data DD', and the data DD' has been adjusted and corrected to be the dummy data DD in aforesaid operation. Accordingly, the fourth data 902 (i.e., the adjusted third data 802') and the error checking and correcting code ECC' now only includes 8 of the error bits EB. Therefore, the number the error bits to be corrected does not exceed a number of the error bits that the error checking and correcting circuit 214 is capable of performing the error correction to. In other words, the error checking and correcting circuit 214 may use the error checking and correcting code ECC' to correct the fourth data 902 in order to obtain the corrected data CCD, and, as shown in FIG. 15A and FIG. 15B, the corrected data CCD is identical to the second data 802, such that the corrected data CCD may also be decompressed in order to obtain the reading data RD (i.e., the writing data WD originally being written).

In summary, the data access method, the memory control circuit unit and the memory storage apparatus according to the exemplary embodiments of the invention are capable of adjusting the read data according to the pattern of the dummy data to correct a part of the read data by the pattern of the dummy data, such that a protection and correction capability of the error checking and correcting code for the rest of the read data may be improved. Accordingly, more error bits may be corrected and a correctness and a reliability of the accessed data may both be ensured.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data access method for a rewritable non-volatile memory module, the rewritable non-volatile memory module comprising a plurality of physical erasing units, and each of the physical erasing units comprising a plurality of physical programming units, the data accessing method comprising:

filling dummy data to first data to generate second data, generating an error checking and correcting code corresponding to the second data, generating an error checking and correcting code frame according to the second data and the error checking and correcting code, writing the error checking and correcting code frame into a first physical programming unit among the physical programming units, and mapping a logical address to the first physical programming unit;

receiving a read command, wherein the read command instructs to read data from the logical address;

reading the error checking and correcting code frame from the first physical programming unit to obtain a reading data stream, wherein the reading data stream comprises third data and the error checking and correcting code;

adjusting the third data according to a pattern of the dummy data to generate fourth data when the third data cannot be corrected by using the error checking and correcting code to obtain corrected data;

using the error checking and correcting code to correct the fourth data to obtain the corrected data, wherein the corrected data is identical to the second data;

removing the dummy data from the corrected data to obtain fifth data.

2. The data access method of claim 1, further comprising:

receiving a write command, wherein the write command instructs to write writing data into the logical address;

compressing the writing data to generate the first data;

decompressing the fifth data to obtain reading data, wherein the reading data is identical to the writing data; and transmitting the reading data in response to the read command.

3. The data access method of claim 1, further comprising:

recording the pattern of the dummy data corresponding to the first physical programming unit into a dummy data entry table, wherein the pattern of the dummy data comprises a length of the dummy data.

4. The data access method of claim 3, wherein the step of filling the dummy data to the first data to generate the second data comprises:

filling the dummy data behind the last data bit of the first data to generate the second data, wherein the step of adjusting the third data according to the pattern of the dummy data in order to generate the fourth data comprises:

identifying the length of the dummy data corresponding to the first physical programming unit according to the dummy data entry table, and replacing a plurality of data bits arranged at the last of the third data by the dummy data to obtain the fourth data according to the length of the dummy data corresponding to the first physical programming unit, wherein a length of the data bits arranged at the last of the third data is equal to the length of the dummy data.

5. The data access method of claim 1, wherein the step of writing the error checking and correcting code frame into the first physical programming unit among the physical programming units comprises:

writing dummy data information and the error checking and correcting code frame into the first physical programming unit, wherein the dummy data information records the pattern of the dummy data corresponding to the first physical programming unit, and the pattern of the dummy data comprises a length of the dummy data.

6. The data access method of claim 5, wherein the step of filling the dummy data to the first data in order to generate the second data comprises: filling the dummy data behind the last bit of the first data to generate the second data, wherein the step of adjusting the third data according to the pattern of the dummy data to generate the fourth data comprises:

reading the dummy data information from the first physical programming unit, identifying the length of the dummy data corresponding to the first physical programming unit according to the read dummy data information, and replacing a plurality of data bits arranged at the last of the third data by the dummy data to obtain the fourth data according to the length of the dummy data corresponding to the first physical programming unit, wherein a length of the data bits arranged at the last of the third data is equal to the length of the dummy data.

7. The data access method of claim 1, wherein the dummy data comprises a plurality of data bits, and a value of each of the data bits is a first value.

8. The data access method of claim 7, wherein the step of filling the dummy data to the first data to generate the second data comprises: filling the dummy data behind the last bit of the first data to generate the second data, wherein the step of adjusting the third data according to the pattern of the dummy data to generate the fourth data comprises:

scanning each data bit of the third data starting from the last data bit of the third data, identifying a group of continuous data bits in the third data, and replacing a value of at least one data bit arranged behind the group of continuous data bits in the third data by the first value, wherein a value of each data bit in the group of continuous data bits is the first value.

9. The data access method of claim 7, wherein the step of filling the dummy data to the first data to generate the second data comprises: filling the dummy data behind the last bit of the first data to generate the second data, wherein the step of adjusting the third data according to the pattern of the dummy data to generate the fourth data comprises:

scanning each data bit of the third data starting from the last data bit of the third data, identifying a group of continuous data bits and another group of continuous data bits in the third data, and replacing a value of at least one data bit arranged behind the another group of continuous data bits in the third data by the first value, wherein a value of each data bit in the group of continuous data bits is the first value, a value of each data bit in the another group of continuous data bits is a second value, the first value is different from the second value, and the group of continuous data bits is arranged behind the another group of continuous data bits.

10. A memory control circuit unit for controlling a rewritable non-volatile memory module, the rewritable non-volatile memory module comprising a plurality of physical erasing units, each of the physical erasing units comprising a plurality of physical programming units, and the memory control circuit unit comprising:

a host interface coupled to a host system;

a memory interface coupled to the rewritable non-volatile memory module;

a memory management circuit coupled to the host interface and the memory interface;

an error checking and correcting circuit coupled to the memory management circuit; and a data compressing/decompressing circuit coupled to the memory management circuit, wherein the data compressing/decompressing circuit fills dummy data to first data to generate second data, the error checking and correcting circuit generates an error checking and correcting code corresponding to the second data, and the memory management circuit further generates an error checking and correcting code frame according to the second data and the error checking and correcting code, issues a command sequence for writing the error checking and correcting code frame into a first physical programming unit among the physical programming units and maps a logical address to the first physical programming unit, wherein the memory management circuit receives a read command, wherein the read command instructs to read data from the logical address, wherein the memory management circuit issues a command sequence for reading the error checking and correcting code frame from the first physical programming unit to obtain a reading data stream, wherein the reading data stream comprises third data and the error checking and correcting code,
    wherein the memory management circuit adjusts the third data according to a pattern of the dummy data to generate fourth data when the third data cannot be corrected by using the error checking and correcting code to obtain corrected data, and the error checking and correcting circuit uses the error checking and correcting code to correct the fourth data to obtain the corrected data, wherein the corrected data is identical to the second data,
    wherein the memory management circuit removes the dummy data from the corrected data to obtain fifth data.

11. The memory control circuit unit of claim 10, wherein the memory management circuit receives a write command, wherein the write command instructs to write writing data into the logical address,
    wherein the data compressing/decompressing circuit compresses the writing data to generate the first data,
    wherein the memory management circuit decompresses the fifth data to obtain reading data, wherein the reading data is identical to the writing data,
    wherein the memory management circuit transmits the reading data in response to the read command.

12. The memory control circuit unit of claim 10, wherein the memory management circuit further records the pattern of the dummy data corresponding to the first physical programming unit into a dummy data entry table, and the pattern of the dummy data comprises a length of the dummy data.

13. The memory control circuit unit of claim 12, wherein in the operation of filling the dummy data to the first data to generate the second data, the data compressing/decompressing circuit further fills the dummy data behind the last data bit of the first data to generate the second data,
    wherein in the operation of adjusting the third data according to the pattern of the dummy data to generate the fourth data, the memory management circuit further identifies the length of the dummy data corresponding to the first physical programming unit according to the dummy data entry table, and replaces a plurality of data bits arranged at the last of the third data by the dummy data to obtain the fourth data according to the length of the dummy data corresponding to the first physical programming unit, wherein a length of the data bits arranged at last of the third data is equal to the length of the dummy data.

14. The memory control circuit unit of claim 10, wherein in the operation of writing the error checking and correcting code frame into the first physical programming unit among the physical programming units, the memory management circuit further writes dummy data information and the error checking and correcting code frame into the first physical programming unit, wherein the dummy data information records the pattern of the dummy data corresponding to the first physical programming unit, and the pattern of the dummy data comprises a length of the dummy data.

15. The memory control circuit unit of claim 14, wherein in the operation of filling the dummy data to the first data to generate the second data, the data compressing/decompressing circuit further fills the dummy data behind the last bit of the first data to generate the second data,
    wherein in the operation of adjusting the third data according to the pattern of the dummy data to generate the fourth data, the memory management circuit further reads the dummy data information from the first physical programming unit, identifies the length of the dummy data corresponding to the first physical programming unit according to the read dummy data information, and replaces a plurality of data bits arranged at the last of the third data by the dummy data to obtain the fourth data according to the length of the dummy data corresponding to the first physical programming unit, wherein a length of the data bits arranged at the last of the third data is equal to the length of the dummy data.

16. The memory control circuit unit of claim 10, wherein the dummy data comprises a plurality of data bits, and a value of each of the data bits is a first value.

17. The memory control circuit unit of claim 16, wherein in the operation of filling the dummy data to the first data to generate the second data, the data compressing/decompressing circuit further fills the dummy data behind the last bit of the first data to generate the second data,
    wherein in the operation of adjusting the third data according to the pattern of the dummy data to generate the fourth data, the memory management circuit further scans each data bit of the third data starting from the last data bit of the third data, identifies a group of continuous data bits in the third data, and replaces a value of at least one data bit arranged behind the group of continuous data bits in the third data by the first value, wherein a value of each data bit in the group of continuous data bits is the first value.

18. The memory control circuit unit of claim 17, wherein in the operation of filling the dummy data to the first data to generate the second data, the data compressing/decompressing circuit further fills the dummy data behind the last bit of the first data to generate the second data,
    wherein in the operation of adjusting the third data by the memory management circuit according to the pattern of the dummy data to generate the fourth data, the memory management circuit further scans each data bit of the third data starting from the last data bit of the third data, identifies a group of continuous data bits and another group of continuous data bits in the third data, and replaces a value of at least one data bit arranged behind the another group of continuous data bits in the third data by the first value,
    wherein a value of each data bit in the group of continuous data bits is the first value, a value of each data bit in the another group of continuous data bits is a second value, the first value is different from the second value, and the group of continuous data bits is arranged behind the another group of continuous data bits.

19. A memory storage apparatus, comprising:
    a connection interface unit configured to couple to a host system;
    a rewritable non-volatile memory module comprising a plurality of physical erasing units, wherein each of the physical erasing units comprises a plurality of physical programming units; and
    a memory control circuit unit coupled to the connection interface unit and the rewritable non-volatile memory module,
    wherein the memory control circuit unit fills dummy data to first data to generate second data, generates an error checking and correcting code corresponding to the second data, generates an error checking and correcting code frame according to the second data and the error checking and correcting code, writes the error checking and correcting code frame into a first physical programming unit among the physical programming units, and maps a logical address to the first physical programming unit, wherein the memory control circuit unit further receives a read command, wherein the read command instructs to read data from the logical address, wherein the memory control circuit unit further reads the error checking and correcting code frame from the first physical programming unit to obtain a reading data stream, and the reading data stream comprises third data and the error checking and correcting code, wherein the memory control circuit unit adjusts the third data according to a pattern of the dummy data to generate fourth data when the third data cannot be corrected by using the error checking and correcting code to obtain corrected data, and uses the error checking and correcting code to correct the fourth data to obtain the corrected data, wherein the corrected data is identical to the second data, wherein the memory control circuit unit removes the dummy data from the corrected data to obtain fifth data.

20. The memory storage apparatus of claim 19, wherein the memory control circuit unit receives a write command, and the write command instructs to write writing data into the logical address, wherein the memory control circuit unit compresses the writing data to generate the first data, wherein the memory control circuit unit decompresses the fifth data to obtain reading data, wherein the reading data is identical to the writing data, wherein the memory control circuit unit transmits the reading data in response to the read command.

21. The memory storage apparatus of claim 19, wherein the memory control circuit unit further records the pattern of the dummy data corresponding to the first physical programming unit into a dummy data entry table, and the pattern of the dummy data comprises a length of the dummy data.

22. The memory storage apparatus of claim 21, wherein in the operation of filling the dummy data to the first data to generate the second data, the memory control circuit unit further fills the dummy data behind the last data bit of the first data to generate the second data, wherein in the operation of adjusting the third data according to the pattern of the dummy data to generate the fourth data, the memory control circuit unit further identifies the length of the dummy data corresponding to the first physical programming unit according to the dummy data entry table, and replaces a plurality of data bits arranged at the last of the third data by the dummy data to obtain the fourth data according to the length of the dummy data corresponding to the first physical programming unit, wherein a length of the data bits arranged at the last of the third data is equal to the length of the dummy data.

23. The memory storage apparatus of claim 19, wherein in the operation of writing the error checking and correcting code frame into the first physical programming unit among the physical programming units, the memory control circuit unit further writes dummy data information and the error checking and correcting code frame into the first physical programming unit, wherein the dummy data information records the pattern of the dummy data corresponding to the first physical programming unit, and the pattern of the dummy data comprises a length of the dummy data.

24. The memory storage apparatus of claim 23, wherein in the operation of filling the dummy data to the first data to generate the second data, the memory control circuit unit further fills the dummy data behind the last bit of the first data to generate the second data, wherein in the operation of adjusting the third data according to the pattern of the dummy data to generate the fourth data, the memory control circuit unit further reads the dummy data information from the first physical programming unit, identifies the length of the dummy data corresponding to the first physical programming unit according to the read dummy data information, and replaces a plurality of data bits arranged at the last of the third data by the dummy data to obtain the fourth data according to the length of the dummy data corresponding to the first physical programming unit, wherein a length of the data bits arranged at the last of the third data is equal to the length of the dummy data.

25. The memory storage apparatus of claim 19, wherein the dummy data comprises a plurality of data bits, and a value of each of the data bits is a first value.

26. The memory storage apparatus of claim 25, wherein in the operation of filling the dummy data to the first data to generate the second data, the memory control circuit unit further fills the dummy data behind the last bit of the first data in order to generate the second data, wherein in the operation of adjusting the third data according to the pattern of the dummy data in order to generate the fourth data, the memory control circuit unit further scans each data bit of the third data starting from the last data bit of the third data, identifies a group of continuous data bits in the third data, and replaces a value of at least one data bit arranged behind the group of continuous data bits in the third data by the first value, wherein a value of each data bit in the group of continuous data bits is the first value.

27. The memory storage apparatus of claim 26, wherein in the operation of filling the dummy data to the first data in order to generate the second data, the memory control circuit unit further fills the dummy data behind the last bit of the first data in order to generate the second data, wherein in the operation of adjusting the third data according to the pattern of the dummy data in order to generate the fourth data, the memory control circuit unit further scans each data bit of the third data starting from the last data bit of the third data, identifies a group of continuous data bits and another group of continuous data bits in the third data, and replaces a value of at least one data bit arranged behind the another group of continuous data bits in the third data by the first value, wherein a value of each data bit in the group of continuous data bits is the first value, a value of each data bit in the another group of continuous data bits is a second value, the first value is different from the second value, and the group of continuous data bits is arranged behind the another group of continuous data bits.

* * * * *